US012677459B2

(12) United States Patent
Kang et al.

(10) Patent No.: US 12,677,459 B2
(45) Date of Patent: Jul. 7, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Sangmin Kang, Suwon-si (KR); Sunggil Kim, Suwon-si (KR); Kyungwook Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 391 days.

(21) Appl. No.: 18/462,724

(22) Filed: Sep. 7, 2023

(65) Prior Publication Data
US 2024/0243183 A1     Jul. 18, 2024

(30) Foreign Application Priority Data
Jan. 13, 2023     (KR) ........................ 10-2023-0005576

(51) Int. Cl.
*H10D 62/83*          (2025.01)
*H10B 41/27*          (2023.01)
(Continued)

(52) U.S. Cl.
CPC ........... *H10D 62/83* (2025.01); *H10D 64/252* (2025.01); *H10D 64/62* (2025.01); *H10B 41/27* (2023.02); *H10B 43/27* (2023.02); *H10W 90/792* (2026.01)

(58) Field of Classification Search
CPC ...... H10D 62/83; H10D 64/252; H10D 64/62; H10B 41/27; H10B 43/27; H10B 43/40; H10B 43/50; H10B 41/35; H10B 41/50; H10B 43/35; H10W 90/792; H01L 24/08; H01L 23/5283; H01L 23/53223; H01L 23/53238; H01L 23/53266; H01L 23/535; (Continued)

(56) References Cited

U.S. PATENT DOCUMENTS

| | | | |
|---|---|---|---|
| 10,867,678 B2 | 12/2020 | Chen et al. | |
| 11,063,062 B2 * | 7/2021 | Iijima | .................... H10B 43/27 |

(Continued)

FOREIGN PATENT DOCUMENTS

EP          1777751 A2     4/2007

*Primary Examiner* — Steven B Gauthier
*Assistant Examiner* — Khatib A Rahman
(74) *Attorney, Agent, or Firm* — Wolf, Greenfield & Sacks, P.C.

(57)          ABSTRACT
A semiconductor device includes: a first substrate structure including a first substrate, circuit devices, and first bonding pads; and a second substrate structure connected to the first substrate structure. The second substrate structure includes: a source structure; gate electrodes stacked and spaced apart from each other below the source structure in a first direction; first contact plugs electrically connected to the gate electrodes and extending in the first direction; a second contact plug extending in the first direction in an external side of the gate electrodes and electrically connected to the source structure through an upper end; a diffusion barrier between the second contact plug and the source structure, wherein a level of a lower end thereof is higher than a level of an uppermost surface of the gate electrodes; and second bonding pads below the gate electrodes and connected to the first bonding pads.

20 Claims, 20 Drawing Sheets

(51) Int. Cl.
| | |
|---|---|
| *H10B 43/27* | (2023.01) |
| *H10D 64/23* | (2025.01) |
| *H10D 64/62* | (2025.01) |
| *H10W 90/00* | (2026.01) |

(58) Field of Classification Search
CPC ........... H01L 24/09; H01L 2224/08123; H01L 2224/08145
See application file for complete search history.

(56)                References Cited

U.S. PATENT DOCUMENTS

| | | | | |
|---|---|---|---|---|
| 11,152,277 | B2 | 10/2021 | Liu | |
| 11,201,107 | B2 * | 12/2021 | Okina | H10W 20/20 |
| 11,233,042 | B2 * | 1/2022 | Kim | H10D 1/692 |
| 11,233,043 | B2 * | 1/2022 | Kim | H10D 84/038 |
| 2020/0027896 | A1 * | 1/2020 | Eom | H10B 43/27 |
| 2020/0144242 | A1 * | 5/2020 | Park | H10P 72/74 |
| 2020/0381413 | A1 * | 12/2020 | Park | H10D 88/00 |
| 2021/0066282 | A1 * | 3/2021 | Kim | H10D 84/038 |
| 2021/0074638 | A1 * | 3/2021 | Sanuki | H10W 20/20 |
| 2021/0375806 | A1 * | 12/2021 | Zhang | H10B 41/27 |
| 2021/0407968 | A1 * | 12/2021 | Kim | H10W 90/00 |
| 2022/0068857 | A1 | 3/2022 | Chen et al. | |
| 2022/0139944 | A1 * | 5/2022 | Hwang | H10B 41/27 |
| | | | | 257/314 |
| 2022/0157847 | A1 * | 5/2022 | Zhang | H10B 43/27 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2023-0005576 filed on Jan. 13, 2023 in the Korean Intellectual Property Office, the disclosure of which is incorporated herein by reference in its entirety.

BACKGROUND

Example embodiments of the present disclosure relate to a semiconductor device and a data storage system including the same.

In an electronic system that requires data storage, a semiconductor device capable of storing high-capacity data may be necessary. Accordingly, a method for increasing the data storage capacity of a semiconductor device is being researched. For example, as one of the methods for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device having improved reliability.

An example embodiment of the present disclosure is to provide a data storage system including a semiconductor device having improved reliability.

A semiconductor device, as manifested in one or more embodiments of the inventive concept, includes: a first substrate structure including a substrate, circuit devices on the substrate, a first interconnection structure on the circuit devices, and first bonding pads on the first interconnection structure; and a second substrate structure connected to the first substrate structure on the first substrate structure and having a first region and a second region, wherein the second substrate structure includes a source structure; gate electrodes stacked and spaced apart from each other below the source structure in a first direction perpendicular to a lower surface of the source structure, extending to different lengths in a second direction in the second region and forming pad regions having different levels; channel structures penetrating through the gate electrodes, extending in the first direction in the first region, and each including a channel layer; first contact plugs electrically connected to the gate electrodes and extending in the first direction in the second region; a second contact plug extending in the first direction in an external side of the gate electrodes and electrically connected to the source structure; a diffusion barrier between the second contact plug and the source structure, extending along a portion of the lower surface of the source structure, and having conductivity; a second interconnection structure below the first and second contact plugs; and second bonding pads below the second interconnection structure and connected to the first bonding pads.

According to an example embodiment of the present disclosure, a semiconductor device includes: a first substrate structure including a substrate, circuit devices on the substrate, and first bonding pads on the circuit devices; and a second substrate structure connected to the first substrate structure on the first substrate structure, wherein the second substrate structure includes a source structure; gate electrodes stacked and spaced apart from each other below the source structure in a first direction perpendicular to a lower surface of the source structure; first contact plugs electrically connected to the gate electrodes and extending in the first direction; a second contact plug extending in the first direction in an external side of the gate electrodes and electrically connected to the source structure through an upper end; a diffusion barrier between the second contact plug and the source structure, wherein a level of a lower end thereof is higher than a level of an uppermost surface of the gate electrodes; and second bonding pads below the gate electrodes and connected to the first bonding pads.

According to an example embodiment of the present disclosure, a data storage system includes: a semiconductor storage device including a first substrate structure including circuit devices and first bonding pads, a second substrate structure including gate electrodes and second bonding pads connected to the first bonding pads, and an input/output pad electrically connected to the circuit devices; and a controller electrically connected to the semiconductor storage device through the input/output pad and configured to control the semiconductor storage device, wherein the second substrate structure further includes a source structure on the gate electrodes; first contact plugs electrically connected to the gate electrodes and extending in a first direction perpendicular to a lower surface of the source structure; a second contact plug extending in the first direction in an external side of the gate electrodes and electrically connected to the source structure through an upper end; and a diffusion barrier between the second contact plug and the source structure, wherein a level of a lower end thereof is higher than a level of an uppermost surface of the gate electrodes.

BRIEF DESCRIPTION OF DRAWINGS

The above and other aspects, features, and advantages of the present disclosure will be more clearly understood from the following detailed description, taken in combination with the accompanying drawings, wherein like reference numerals (when used) indicate corresponding elements throughout the several views, and in which.

DETAILED DESCRIPTION

Hereinafter, embodiments of the present disclosure will be described as follows with reference to the accompanying drawings.

Figure 1:
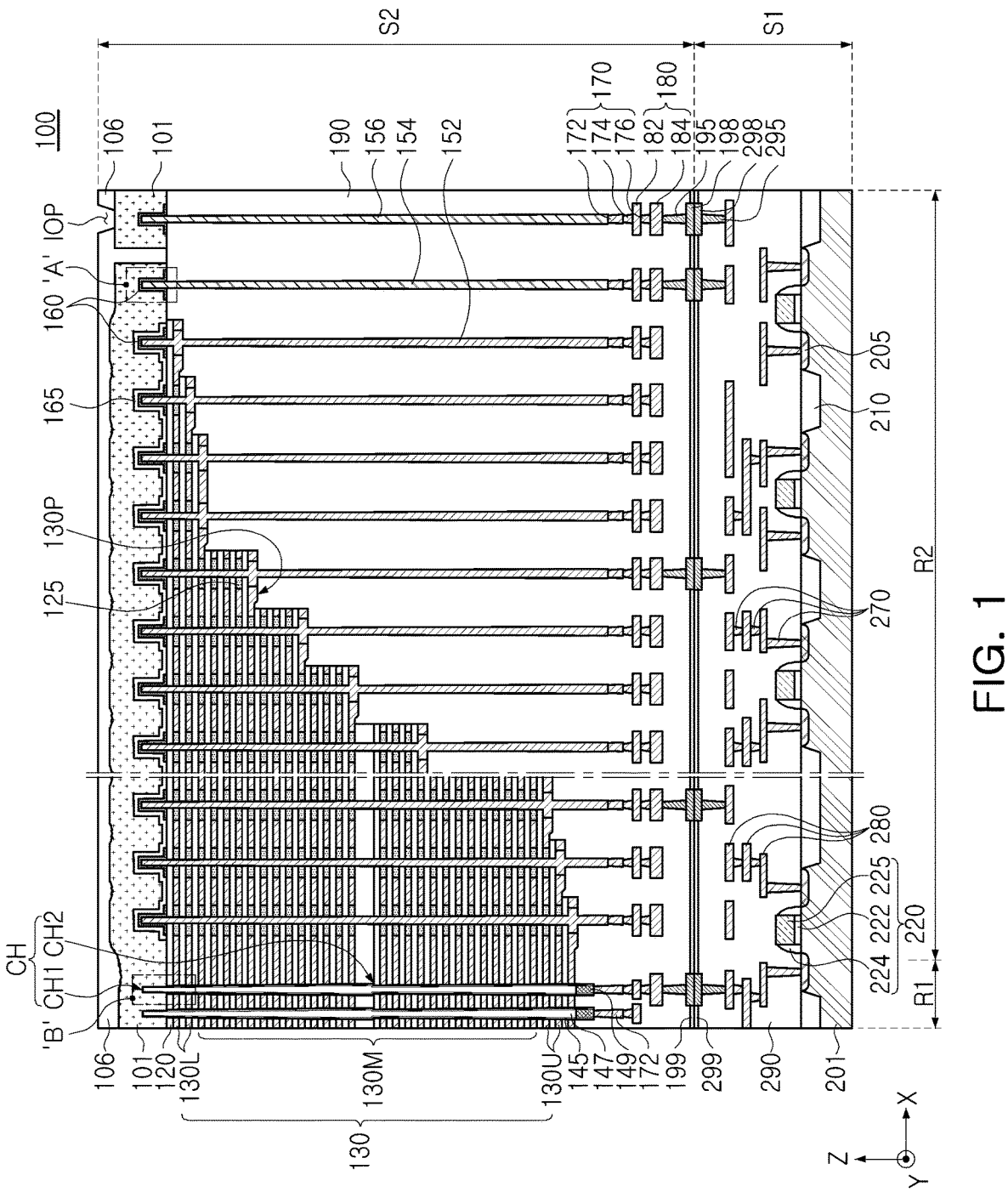
FIG. 1 is a cross-sectional view illustrating at least a portion of an example semiconductor device according to one or more embodiments of the present disclosure.

FIG. 1 is a cross-sectional view illustrating at least a portion of an example semiconductor device according to one or more embodiments.

Figure 2A:
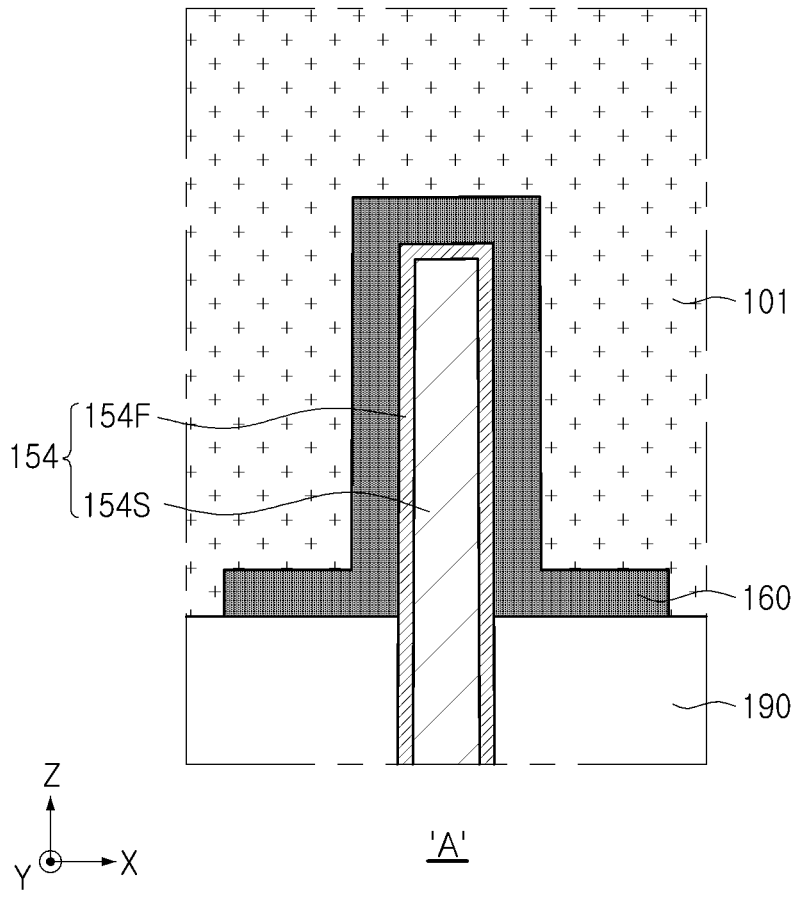
FIGS. 2A and 2B are enlarged views illustrating a portion of a semiconductor device according to an example embodiment of the present disclosure.
Figure 2B:
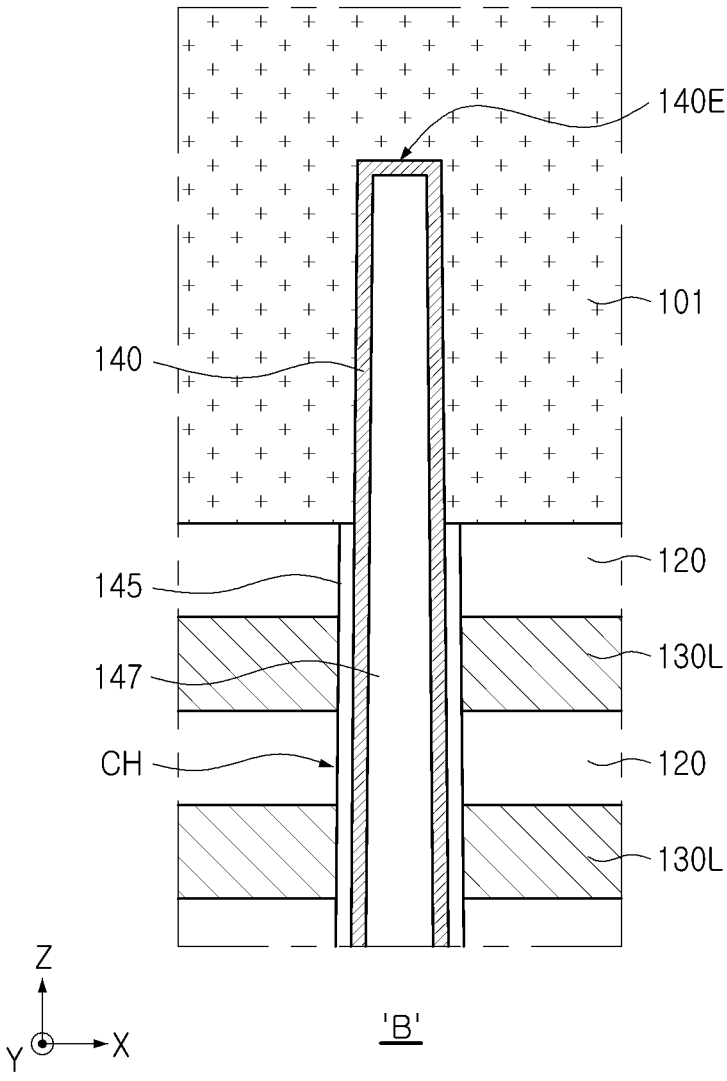

FIGS. 2A and 2B are enlarged views illustrating a portion of a semiconductor device according to an example embodiment. FIG. 2A is an enlarged view illustrating region "A" in FIG. 1, and FIG. 2B is an enlarged view illustrating region "B" in FIG. 1.

Referring to FIGS. 1 to 2B, a semiconductor device 100 may include first and second substrate structures S1 and S2 bonded to each other vertically (i.e., in a Z direction). The first substrate structure S1 may include a peripheral circuit region, and the second substrate structure S2 may include a memory cell region.

The first substrate structure S1 may include a substrate 201, source/drain regions 205 and device isolation layers 210 (e.g., shallow trench isolation (STI) or local oxidation of silicon (LOCOS) structures) in the substrate 201, circuit devices 220 disposed on the substrate 201, a peripheral region insulating layer 290, circuit contact plugs 270, circuit interconnection lines 280, first bonding vias 295, first bonding pads 298, and a first bonding insulating layer 299.

The substrate 201 may have an upper surface extending in the X and Y-directions. The device isolation layers 210 may be formed on the substrate 201 and may define an active region. The source/drain regions 205 including impurities may be disposed in a portion of the active region. The substrate 201 may include a semiconductor material, for example, a group IV semiconductor, a group III-V compound semiconductor, or a group II-VI compound semiconductor. For example, the substrate 201 may be provided as a single crystal bulk wafer.

The circuit devices 220 may include planar transistors. Each of the circuit devices 220 may include a circuit gate dielectric layer 222, spacer layers 224 and a circuit gate electrode 225. The source/drain regions 205 may be disposed in the substrate 201 on both sides of the circuit gate electrode 225.

The peripheral region insulating layer 290 may be disposed on the circuit devices 220 on the substrate 201. The peripheral region insulating layer 290 may include a plurality of insulating layers formed by different processes. The peripheral region insulating layer 290 may comprise an insulating material (e.g., silicon dioxide).

The circuit contact plugs 270 and the circuit interconnection lines 280 may be included in a first interconnection structure of the first substrate structure S1. The circuit contact plugs 270 may have a cylindrical shape and may penetrate through the peripheral region insulating layer 290 and at least a subset of the circuit contact plugs 270 may be connected to the source/drain regions 205. An electrical signal may be applied to the circuit device 220 by the circuit contact plugs 270. In a region not explicitly illustrated (but implied), the circuit contact plugs 270 may also be connected to the circuit gate electrode 225. The circuit interconnection lines 280 may be connected to the circuit contact plugs 270 and may have a line shape. The circuit contact plugs 270 and circuit interconnection lines 280 may include a conductive material, for example, but not limited to, tungsten (W), copper (Cu), aluminum (Al), and the like, and each component may further include a diffusion barrier. However, in example embodiments, the number of layers of the circuit contact plugs 270 and the circuit interconnection lines 280 and arrangement thereof may be varied.

The first bonding vias 295, the first bonding pads 298, and the first bonding insulating layer 299 may be included in a first bonding structure and may be disposed on the uppermost circuit interconnection lines 280. The first bonding vias 295 may have a cylindrical shape, and the first bonding pads 298 may have a line shape. Upper surfaces of the first bonding pads 298 and the first bonding insulating layer 299 may be exposed to an upper surface of the first substrate structure S1. The first bonding vias 295 and the first bonding pads 298 may provide an electrical connection path between the first substrate structure S1 and the second substrate structure S2. A portion of the first bonding pads 298 may, in some embodiments, be disposed only for bonding without being connected to the lower circuit interconnection lines 280. The first bonding vias 295 and the first bonding pads 298 may include a conductive material, for example copper (Cu), although embodiments of the inventive concept are not limited thereto. The first bonding insulating layer 299 may be disposed around the first bonding pads 298. The term "around" (or "surround," "surrounding," or the like) as may be used herein is intended to broadly refer to a structure, component or layer that envelops, encircles, or encloses another, structure, component or layer on all sides, although breaks or gaps may also be present. Thus, for example, a material layer having voids or gaps therein may still be considered as being "around" another layer which it encircles. The first bonding insulating layer 299 may also function as a diffusion barrier of the first bonding pads 298 and may include, for example, at least one of silicon nitride (SiN), silicon oxynitride (SiON), silicon carbon nitride (SiCN), silicon oxycarbide (SiOC), silicon oxycarbonitride (SiOCN), and silicon oxide (SiO). The term "at least one of," as used herein, is intended to include any and all combinations of one or more of the associated listed items.

The second substrate structure S2 may have a first region R1 and a second region R2, and may include a source structure 101, gate electrodes 130 stacked on a lower surface of the source structure 101, interlayer insulating layers 120 alternately stacked with the gate electrodes 130, channel structures CH disposed to penetrate through the gate electrodes 130 in first region R1, first contact plugs 152 connected to the gate electrodes 130 in the second region R2, a second contact plug 154 electrically connected to the source structure 101 in the second region R2, a third contact plug 156 electrically connected to an input/output pad region IOP in the second region R2, and diffusion barriers 160 covering upper ends of the first to third contact plugs 152, 154 and 156. The term "covering" (or "covers," or similar language) as used herein is intended to refer broadly to a first material, layer, structure or other element that is disposed on or over at least a second material, layer, structure or other element, but does not necessarily require complete or total coverage of the second material, layer, structure or other element by the first material, layer, structure or other element. The second substrate structure S2 may further include a passivation layer 106, contact insulating layers 125, an upper insulating layer 165, and cell region insulating layers 190. The second substrate structure S2 may further include cell contact plugs 170 and cell interconnection lines 180 as a second interconnection structure. The second substrate structure S2 may further include second bonding vias 195, second bonding pads 198, and a second bonding insulating layer 199 as a second bonding structure.

In the first region R1 of the second substrate structure S2, the gate electrodes 130 may be vertically stacked (i.e., in the Z direction), and the channel structures CH may be disposed in a region in which memory cells may be disposed. In the second region R2 of second substrate structure S2, the gate electrodes 130 may extend to different lengths (in the X direction) and may be connected to the first contact plugs 152, and may be a region for electrically connecting the memory cells to the first substrate structure S1. The second region R2 may be disposed on at least one end of the first region R1 in at least one direction (X- and/or Y-direction).

The source structure 101 may have an upper surface extending in the X- and Y-directions. The source structure 101 may function as a common source line of the semiconductor device 100. The source structure 101 may include a conductive or semiconductive material. For example, the source structure 101 may include a semiconductor material, such as a group IV semiconductor, a group III-V compound semiconductor, or a group II-VI compound semiconductor. For example, the group IV semiconductor may include silicon, germanium, or silicon-germanium. The source structure 101 may further include impurities. The source structure 101 may be provided as a polycrystalline semiconductor layer such as a polycrystalline silicon layer or an epitaxial layer. In some example embodiments, the source structure 101 may include a plurality of vertically stacked conductive layers.

The gate electrodes 130 may be vertically stacked and spaced apart from each other on the lower surface of the source structure 101 and may form a stack structure together with the interlayer insulating layers 120. The stack structure may include lower and upper stack structures vertically stacked and surrounding first and second channel structures CH1 and CH2, respectively. However, in example embodiments, the stack structure may include a single stack structure.

The gate electrodes 130 may include at least one lower gate electrode 130L forming a gate of a ground selection transistor, memory gate electrodes 130M forming a plurality of memory cells, and upper gate electrodes 130U forming gates of string selection transistors. Here, the terms of "lower" and "upper" in the lower and upper stack structures, the lower gate electrode 130L, and the upper gate electrodes 130U may be denoted based on the directions during the manufacturing process. It is to be appreciated, however, that spatially descriptive terms such as "upper," "lower," "above," "below," "under," "over," and the like, as may be used herein, are intended to indicate a position of elements, structures or features relative to one another as illustrated in the figures, rather than an absolute position. The number of memory gate electrodes 130M included in the memory cells may be determined depending on capacity of the semiconductor device 100. In example embodiments, each of the number of the upper gate electrodes 130U and the number of the lower gate electrodes 130L may be 1 to 4 or more, and may have the same structure as or different structures from the memory gate electrodes 130M. In example embodiments, the gate electrodes 130 may further include a gate electrode 130 disposed below the upper gate electrodes 130U and/or on the lower gate electrode 130L and forming an erase transistor used for erase operation using a gate induced drain leakage (GIDL) phenomenon. GIDL may occur where the gate partially overlaps the drain of a metal-oxide semiconductor field-effect transistor (MOSFET) forming a gate-to-drain overlap region in the MOSFET, and GIDL current is due primarily to a band-to-band tunneling process in the gate-to-drain overlap region. Also, a portion of the gate electrodes 130, for example, memory gate electrodes 130M adjacent to the upper or lower gate electrodes 130U and 130L may be dummy gate electrodes.

The gate electrodes 130 may be vertically stacked and spaced apart from each other on the first region R1 and the second region R2, may extend to different lengths from the first region R1 to the second region R2 and may form a stepped structure having different levels in a portion of the second region R2. The gate electrodes 130 may be disposed to have a stepped structure in the X-direction as well. Due to the stepped structure, the upper gate electrode 130 may extend longer than the lower gate electrode 130 such that the gate electrodes 130 may have regions of which lower surfaces may be exposed downwardly from the interlayer insulating layers 120 and the other gate electrodes 130, and the regions may be referred to as pad regions 130P. The gate electrodes 130 may be connected to the first contact plugs 152 in the pad regions 130P. The gate electrodes 130 may have an increased thickness in the pad regions 130P.

The gate electrodes 130 may include a metal material, such as tungsten (W). In example embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), titanium nitride (TiN), or a combination thereof.

The interlayer insulating layers 120 may be disposed between the gate electrodes 130 in an alternating arrangement. Similarly to the gate electrodes 130, the interlayer insulating layers 120 may be spaced apart from each other in a direction perpendicular to the lower surface of the source structure 101 and may extend in the Y-direction. The interlayer insulating layers 120 may include an insulating material such as silicon oxide or silicon nitride, although embodiments of the present disclosure are not limited thereto.

Each of the channel structures CH may form a memory cell string, and may be spaced apart from each other while forming rows and columns on the lower surface of the source structure 101 in the first region R1. The channel structures CH may be disposed to form a lattice pattern in a plan view or may be disposed, for example, in a zigzag pattern in one direction. The channel structures CH may have a column shape and may have an inclined side surface such that a width thereof may decrease toward the source structure 101 depending on an aspect ratio. In example embodiments, a portion of the channel structures CH may be a dummy channel not substantially forming a memory cell string, and for example, a portion disposed adjacent to the second region R2 may be a dummy channel.

Each of the channel structures CH may have a form in which the first and second channel structures CH1 and CH2 penetrating through the lower and upper stack structures of the gate electrodes 130 may be connected to each other, and may have a bent portion due to a difference or a change in width (in the X- and/or Y-direction) in the connection region. However, in example embodiments, the number of channel structures stacked in the Z-direction may be varied.

Each of the channel structures CH may include a channel layer 140 (see FIG. 2B), a gate dielectric layer 145, a channel buried insulating layer 147, and a channel pad 149 disposed in a channel hole. The channel layer 140 may be formed in an annular shape surrounding the channel buried insulating layer 147 therein, or may have a column shape such as a cylindrical shape or a prism shape without the channel buried insulating layer 147 in example embodiments. The channel layer 140 may include a semiconductor material such as, for example, polycrystalline silicon or monocrystalline silicon, although embodiments of the present disclosure are not limited thereto. The channel layer 140 may be exposed through an upper end 140E and may be connected to the source structure 101.

More particularly, as illustrated in FIG. 2B, the upper end 140E of the channel layer 140 may be exposed from the channel dielectric layer 145 on the upper end of the channel structure CH. The upper end 140E of the channel layer 140 may include an upper surface and an upper region of a side surface connected to the upper surface. The upper end 140E of the channel layer 140 may be in direct contact with the source structure 101 and may be surrounded by the source structure 101. By this arrangement, the channel layer 140 may be physically and electrically connected to the source structure 101.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high dielectric constant (i.e., high-k) dielectric material, or a combination thereof. In example embodiments, at least a portion of the gate dielectric layer 145 may extend in a horizontal direction along the gate electrodes 130.

The channel pad 149 may be disposed only on the lower end of the lower second channel structure CH2, as shown in FIG. 1. The channel pads 149 may include, for example, doped polycrystalline silicon.

With continued reference to FIGS. 1 and 2B, the channel layer 140, the gate dielectric layer 145, and the channel buried insulating layer 147 may be connected to each other between the first channel structure CH1 and the second channel structure CH2. An interlayer insulating layer 120 having a relatively thick thickness (in the Z-direction) may be further disposed between the first channel structure CH1 and the second channel structure CH2. However, the thickness of the interlayer insulating layers 120 may be varied in example embodiments.

The first to third contact plugs 152, 154, and 156 may be disposed in the second region R2. The first to third contact plugs 152, 154, and 156 may extend in the Z-direction, and may have inclined side surfaces such that widths thereof may decrease toward the source structure 101. The first to third contact plugs 152, 154, and 156 may be disposed on substantially the same level or similar levels. The lower ends of the first to third contact plugs 152, 154, and 156 may be disposed on substantially the same level (i.e., coplanar), but an example embodiment thereof is not limited thereto. Upper ends of the first to third contact plugs 152, 154, and 156 may be disposed on the lower surface of the source structure 101, for example, disposed at the lower surface or in the source structure 101. Upper ends of the first to third contact plugs 152, 154, and 156 may be covered by the diffusion barriers 160, which will be described in greater detail in the description of the diffusion barriers 160 below in conjunction with FIG. 2A.

The first contact plugs 152 may electrically connect the gate electrodes 130 to the circuit interconnection lines 280 in the first substrate structure S1. Each of the first contact plugs 152 may be physically and electrically connected to a corresponding one of the gate electrodes 130 and each of the pad region 130P and may apply an electrical signal to the corresponding one of the gate electrodes 130. The first contact plugs 152 may penetrate through the pad regions 130P of the gate electrodes 130. The first contact plugs 152 may be disposed to extend into the source structure 101 through a region where the gate electrodes 130 form a stepped structure.

The first contact plugs 152 may have a horizontally extended shape in the pad regions 130P. The first contact plugs 152 may be spaced apart from the gate electrodes 130 on the pad regions 130P by the contact insulating layers 125. The contact insulating layers 125 may surround a side surface of the first contact plug 152 and may be isolated from each other in the Z-direction. The contact insulating layers 125 may be disposed on substantially the same level as a level of the gate electrodes 130. The contact insulating layers 125 may include an insulating material such as silicon oxide, silicon nitride, or silicon oxynitride.

The second and third contact plugs 154 and 156 may be disposed in a region in which the gate electrodes 130 are not disposed, for example, on an external side of the gate electrodes 130. The term "external side" as used herein is intended to refer to an area of the semiconductor device that is outside an end of the gate electrodes 130 in the X-direction; that is, an area laterally adjacent to the end of the gate electrodes 130 (where no gate electrodes are present). In FIG. 1, the number of the second contact plug 154 and the number of the third contact plug 156 may be one, but an example embodiment thereof is not limited thereto, and for example, a plurality of the second and third contact plugs 154 and 156 may be spaced apart from each other.

The second contact plug 154 may electrically connect the circuit devices 220 of the first substrate structure S1 to the source structure 101. The second contact plug 154 may penetrate through a portion of the cell region insulating layer 190 and may extend into the source structure 101 at an end thereof.

The third contact plug 156 may electrically connect the circuit devices 220 of the first substrate structure S1 to the input/output pad region IOP. The third contact plug 156 may penetrate through a portion of the cell region insulating layer 190 and may extend into an island (i.e., isolated) region of the source structure 101. The island region may be isolated from a region of the source structure 101 connected to channel structures CH. The island region may be partially upwardly exposed through the passivation layer 106, and may form an input/output pad region IOP for electrical connection with an external device.

As illustrated in FIG. 2A, the second contact plug 154 may include a first contact layer 154F, forming an internal side surface and an upper surface of a contact hole, and a second contact layer 154S filling the contact hole. As may be used herein, the term "fill" (or "filled," "filling," or the like)

is intended to refer to either completely filling a defined space (e.g., contact hole) or partially filling the defined space; that is, the defined space need not be entirely filled but may, for example, be partially filled or have voids or other spaces throughout. The first contact layer 154F may be a barrier layer, and may include, for example, tungsten nitride (WN), tantalum nitride (TaN), titanium nitride (TiN), or a combination thereof. The second contact layer 154S may include a material having a resistivity lower than that of the first contact layer 154F, and may include, for example, tungsten (W), aluminum (Al), copper (Cu), or a combination thereof.

The first to third contact plugs 152, 154, and 156 may have the same internal structure and may include the same material. For example, the first and third contact plugs 152 and 156 may have the same structure as those of the first and second contact layers 154F and 154S described above with reference to FIG. 2A. Alternatively, the second and third contact plugs 154 and 156 may have the same internal structure, and the first contact plugs 152 may have an internal structure different from that of the second and third contact plugs 154 and 156. The first to third contact plugs 152, 154, and 156 may include a metallic material, such as tungsten (W), aluminum (Al), copper (Cu), tungsten nitride (WN), tantalum nitride (TaN), titanium nitride (TiN), or combinations thereof.

The diffusion barriers 160 may be disposed between the first to third contact plugs 152, 154, and 156 and the source structure 101. The diffusion barriers 160 may cover upper ends of the first to third contact plugs 152, 154, and 156, and may be isolated from each other between the first to third contact plugs 152, 154, and 156 adjacent to each other. Specifically, the diffusion barriers 160 may cover upper surfaces of the first to third contact plugs 152, 154, and 156 and portions of side surfaces connected to the upper surfaces in the source structure 101. The diffusion barriers 160 may be provided to prevent a metal material included in the first to third contact plugs 152, 154, and 156 from mixing (e.g., diffusing) with a material of the source structure 101 and to uniformly crystallize the source structure 101 during a process of crystallization of the source structure 101 during the process of manufacturing the semiconductor device 100. The diffusion barriers 160 may have protrusions along upper ends of the first to third contact plugs 152, 154, and 156 (e.g., in the X- and/or Y-direction), and accordingly, the source structure 101 may also have an uneven upper surface.

The diffusion barriers 160 may be disposed in the source structure 101 and may not extend to a region below the lower surface of the source structure 101. Accordingly, the diffusion barriers 160 may expose the side surfaces of the first to third contact plugs 152, 154, and 156 below the source structure 101 without covering the side surfaces. A level of the lower end or lowermost surface of the diffusion barrier 160 may be higher than that of the uppermost surface of the gate electrodes 130. A level of the lower end or the lowermost surface of the diffusion barrier 160 may be substantially the same as a level of the lowermost surface of the source structure 101, but an example embodiment thereof is not limited thereto. A level of the upper end or uppermost surface of the diffusion barrier 160 may be equal to or lower than a level of the upper end or the uppermost surface of the source structure 101. In some embodiments, the diffusion barrier 160 may comprise a plurality of diffusion barriers (e.g., as a stacked diffusion barrier structure).

The diffusion barriers 160 may be isolated from each other between the first contact plugs 152 adjacent to each other and may not extend to the first region R1. Accordingly, the diffusion barriers 160 may not be disposed on the channel structures CH. The diffusion barriers 160 may include regions extending horizontally between the first contact plugs 152 along the lower surface of the source structure 101. The diffusion barriers 160 may include first layers on the first contact plugs 152, a second layer on the second contact plugs 154, and a third layer on the third contact plugs 156, and the first to third layers may be spaced apart from each other in a horizontal direction.

The diffusion barriers 160 may have conductivity for electrical connection between the second and third contact plugs 154 and 156 and the source structure 101 and may be formed of a conductive material. The term "conductivity" as used herein may be defined in a traditional sense to refer to a material having an ability to conduct electricity, which may include, for example, materials such as conductors (e.g., metals) and semiconductors, as well as materials that may be considered insulators intrinsically, but are doped with an impurity of a prescribed concentration level so that electrical conduction may occur. The diffusion barriers 160 may include a material having a melting point which is higher than that of amorphous silicon. For example, the melting point of the diffusion barriers 160 may be higher than about 1400° C., which is the melting point of amorphous silicon, and may be in the range of about 2000° C. to about 5000° C., in some embodiments. In example embodiments, the source structure 101 may be formed by crystallizing amorphous silicon. In this case, even when the temperature is relatively increased during the crystallization process, the diffusion barriers 160 may not react with the first to third contact plugs 152, 154, and 156 and may be stably maintained. A process temperature of the crystallization process may be in the range of about 1100° C. to about 1400° C., and the melting point of the diffusion barriers 160 may be higher than the process temperature.

The diffusion barriers 160 may include at least one of a Si—C-based material, a metal nitride, and a two-dimensional layered semiconductor material. The Si—C-based material may be, for example, SiC. The metal nitride may be, for example, at least one of tungsten nitride (WN), tantalum nitride (TaN), and titanium nitride (TiN). The two-dimensional layered semiconductor material may be at least one of graphene, boron nitride (BN), boron carbon nitride (BCN), molybdenum disulfide ($MoS_2$), molybdenum diselenide ($MoSe_2$), tungsten disulfide ($WS_2$), and tungsten diselenide ($WSe_2$). A thickness of the diffusion barriers 160 may be less than or equal to about 10 nanometers (nm), for example, in the range of about 0.1 nm to about 10 nm. When the thickness of the diffusion barriers 160 is smaller than the above illustrative range, the prevention of diffusion of the metal material described above may not be as effective, and when the thickness is larger than the above range, contact resistance may increase.

The upper insulating layer 165 may be disposed between the first contact plugs 152 and the source structure 101, specifically, between the diffusion barriers 160 on the first contact plugs 152 and the source structure 101 in the second region R2. The upper insulating layer 165 may prevent the first contact plugs 152 and the diffusion barriers 160 from being electrically connected to the source structure 101. The upper insulating layer 165 may cover ends of the diffusion barriers 160.

The upper insulating layer 165 may cover the diffusion barriers 160 on the first contact plugs 152 and may be disposed as a single layer, but an example embodiment thereof is not limited thereto. In some example embodiments, the upper insulating layer 165 may also cover each of the diffusion barriers 160 and may be disposed as a plurality of layers spaced apart from each other. The upper insulating layer 165 may not extend to the first region R1 and may not extend onto the second contact plug 154 in the second region R2. Relative thicknesses of the upper insulating layer 165 and the diffusion barrier 160 are not limited to the examples illustrated in FIG. 1. The upper insulating layer 165 may include an insulating material such as, for example, at least one of silicon oxide, silicon nitride, and silicon carbide.

The second interconnection structure may include cell contact plugs 170 and cell interconnection lines 180 such that the second substrate structure S2 may be electrically connected to the first substrate structure S1.

The cell contact plugs 170 may include first to third cell contact plugs 172, 174, and 176, and the cell interconnection lines 180 may include first and second cell interconnection lines 182 and 184. The channel pads 149 and the first to third contact plugs 152, 154, and 156 may be connected to the first cell contact plugs 172 on lower ends. The first cell contact plugs 172 may be connected to the second cell contact plugs 174 on a lower end, and the second cell contact plugs 174 may be connected to the first cell interconnection lines 182 on lower ends. The third cell contact plugs 176 may connect the first and second cell interconnection lines 182 and 184 vertically (i.e., in the Z-direction). The cell contact plugs 170 may have a cylindrical shape. The cell contact plugs 170 may have different lengths. For example, the first cell contact plugs 172 may have a relatively long length. In example embodiments, the cell contact plugs 170 may have inclined side surfaces such that a width may decrease toward the source structure 101 and may increase toward the first substrate structure S1 depending on an aspect ratio.

The first cell interconnection lines 182 may include bit lines of the first region R1 connected to channel structures CH and interconnection lines of the second region R2 disposed on the same level as a level of the bit lines. The second cell interconnection lines 184 may be interconnection lines disposed below the first cell interconnection lines 182. The cell interconnection lines 180 may have a line shape extending in at least one direction. In example embodiments, the second cell interconnection lines 184 may have a greater thickness than that of the first cell interconnection lines 182. The cell interconnection lines 180 may have inclined side surfaces such that a width may decrease as the cell interconnection lines 180 extend toward the source structure 101.

The cell contact plugs 170 and the cell interconnection lines 180 may include, for example, tungsten (W), aluminum (Al), copper (Cu), tungsten nitride (WN), tantalum nitride (TaN), titanium nitride (TiN), or combinations thereof, although embodiments of the present disclosure are not limited thereto.

The second bonding vias 195 of the second bonding structure may be disposed below the second cell interconnection lines 184 and may be connected to the second cell interconnection lines 184, and the second bonding pads 198 of the second bonding structure may be connected to the second bonding vias 195. The lower surfaces of the second bonding pads 198 may be exposed to the lower surface of the second substrate structure S2. The second bonding pads 198 may be bonded and connected to the first bonding pads 298 of the first substrate structure S1, and the second bonding insulating layer 199 may be bonded and connected to the first bonding insulating layer 299 of the first substrate structure S1. The second bonding vias 195 and the second bonding pads 198 may include a conductive material, for example copper (Cu). The second bonding insulating layer 199 may include, for example, at least one of SiO, SiN, SiCN, SiOC, SiON, and SiOCN.

The first and second substrate structures S1 and S2 may be bonded to each other by bonding between the first bonding pads 298 and the second bonding pads 198 and bonding between the first bonding insulating layer 299 and the second bonding insulating layer 199. The bonding between the first bonding pads 298 and the second bonding pads 198 may include, for example, copper Cu-to-copper Cu bonding (or another metal-to-metal, or other conductor-to-conductor bonding process), and the bonding between the first bonding insulating layer 299 and the second bonding insulating layer 199 may include, for example, dielectric-to-dielectric bonding such as SiCN-to-SiCN bonding. The first and second substrate structures S1 and S2 may be bonded to each other by hybrid bonding, including copper Cu-to-copper Cu bonding and dielectric-to-dielectric bonding.

The cell region insulating layer 190 may be disposed to cover the lower surface of the source structure 101 and the gate electrodes 130 on the lower surface of the source structure 101. The passivation layer 106 may be disposed on the upper surface of the source structure 101 and may have an opening exposing the input/output pad region IOP. The passivation layer 106 may function as a layer protecting the semiconductor device 100.

The cell region insulating layer 190 and passivation layer 106 may include an insulating material, for example, at least one of silicon oxide, silicon nitride, and silicon carbide, and may include a plurality of insulating layers in example embodiments.

Figure 3:
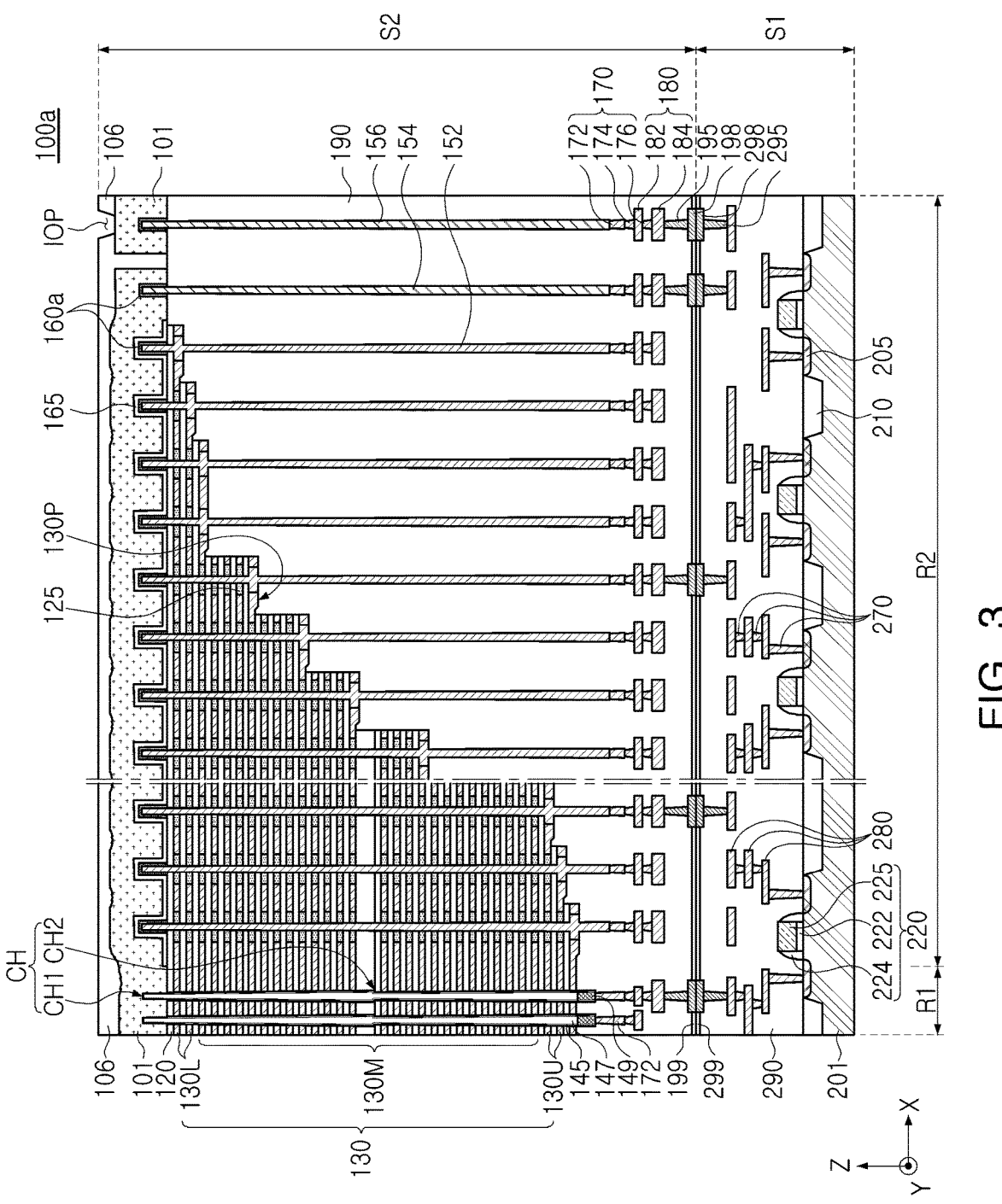
FIG. 3 is a cross-sectional view illustrating at least a portion of an example semiconductor device according to one or more embodiments of the present disclosure.

FIG. 3 is a cross-sectional view illustrating at least a portion of an example semiconductor device 100a, according to one or more embodiments.

Referring to FIG. 3, in the semiconductor device 100a, diffusion barriers 160a may have different shapes from the example in the illustrative embodiment of the device 100 shown in FIG. 1. Specifically, each of the diffusion barriers 160a in the semiconductor device 100a of FIG. 3 may cover a portion of the upper and side surfaces of the first contact plug 152, and may not extend horizontally along the lower surface of the source structure 101.

Figure 4:
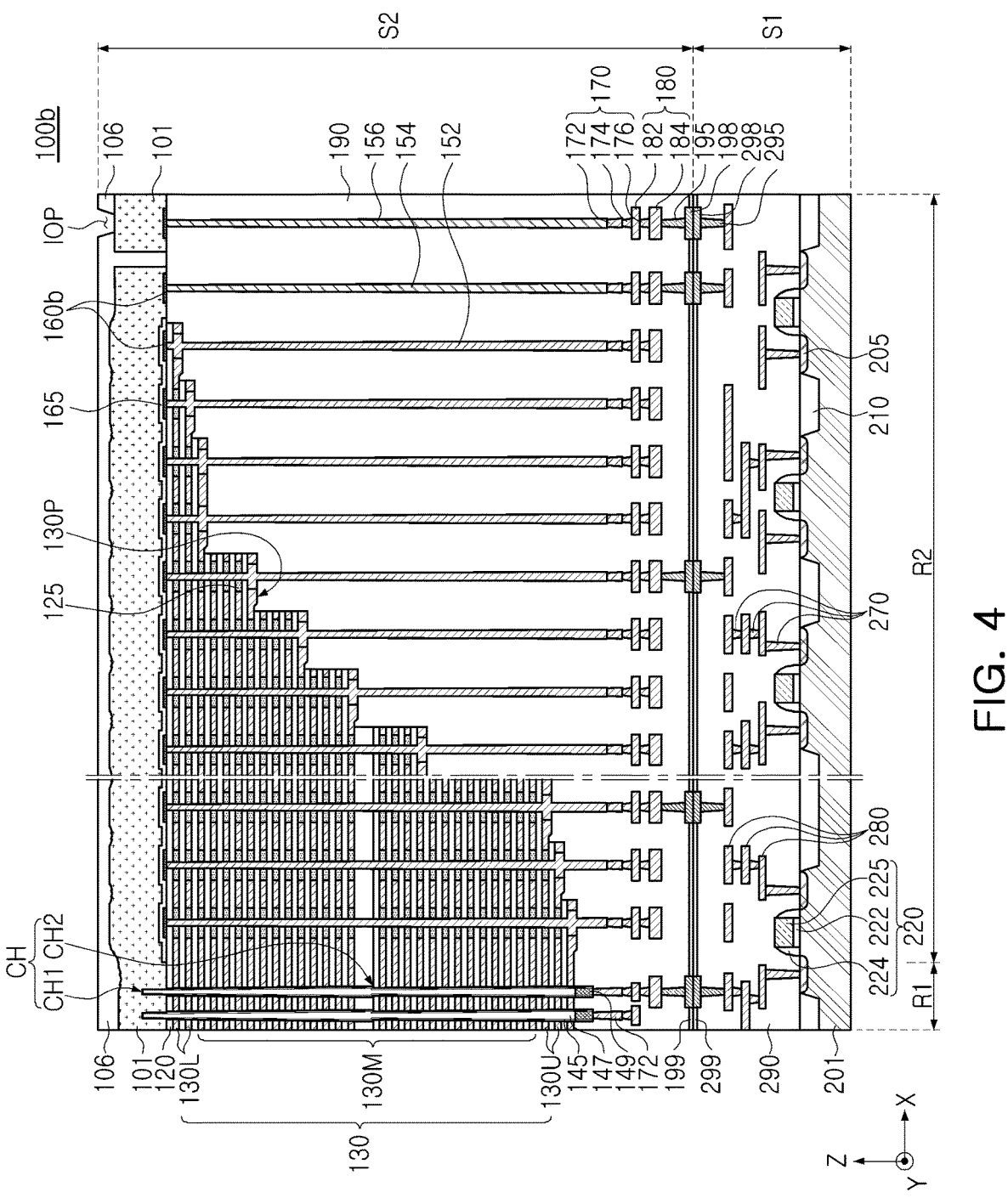
FIG. 4 is a cross-sectional view illustrating at least a portion of an example semiconductor device according to one or more embodiments of the present disclosure.

FIG. 4 is a cross-sectional view illustrating at least a portion of an example semiconductor device 100b, according to one or more embodiments.

Referring to FIG. 4, in the semiconductor device 100b, the first to third contact plugs 152, 154, and 156 may not extend into the source structure 101, and accordingly, diffusion barriers 160b and upper insulating layer 165 may have flat upper surfaces and flat lower surfaces.

Upper surfaces of the first to third contact plugs 152, 154, and 156 may be disposed on substantially the same level as a level of a lower surface of the source structure 101 and/or an upper surface of the uppermost interlayer insulating layer 120; that is, the upper surfaces of the first to third contact plugs 152, 154, and 156 may be substantially coplanar with the lower surface of the source structure 101 and/or the upper surface of the uppermost insulating layer 120. The diffusion barriers 160b may cover upper surfaces of the first to third contact plugs 152, 154, and 156 and may extend in a flat shape in the horizontal direction (i.e., in the X- and/or Y-direction). This structure may be formed by partially removing the upper portion of the first to third contact plugs 152, 154, and 156 using a planarization process (e.g., chemical-mechanical polishing/planarization (CMP)) and forming the diffusion barriers 160b, an upper insulating layer 165, and a source structure 101 when manufacturing the semiconductor device 100b.

Figure 5:
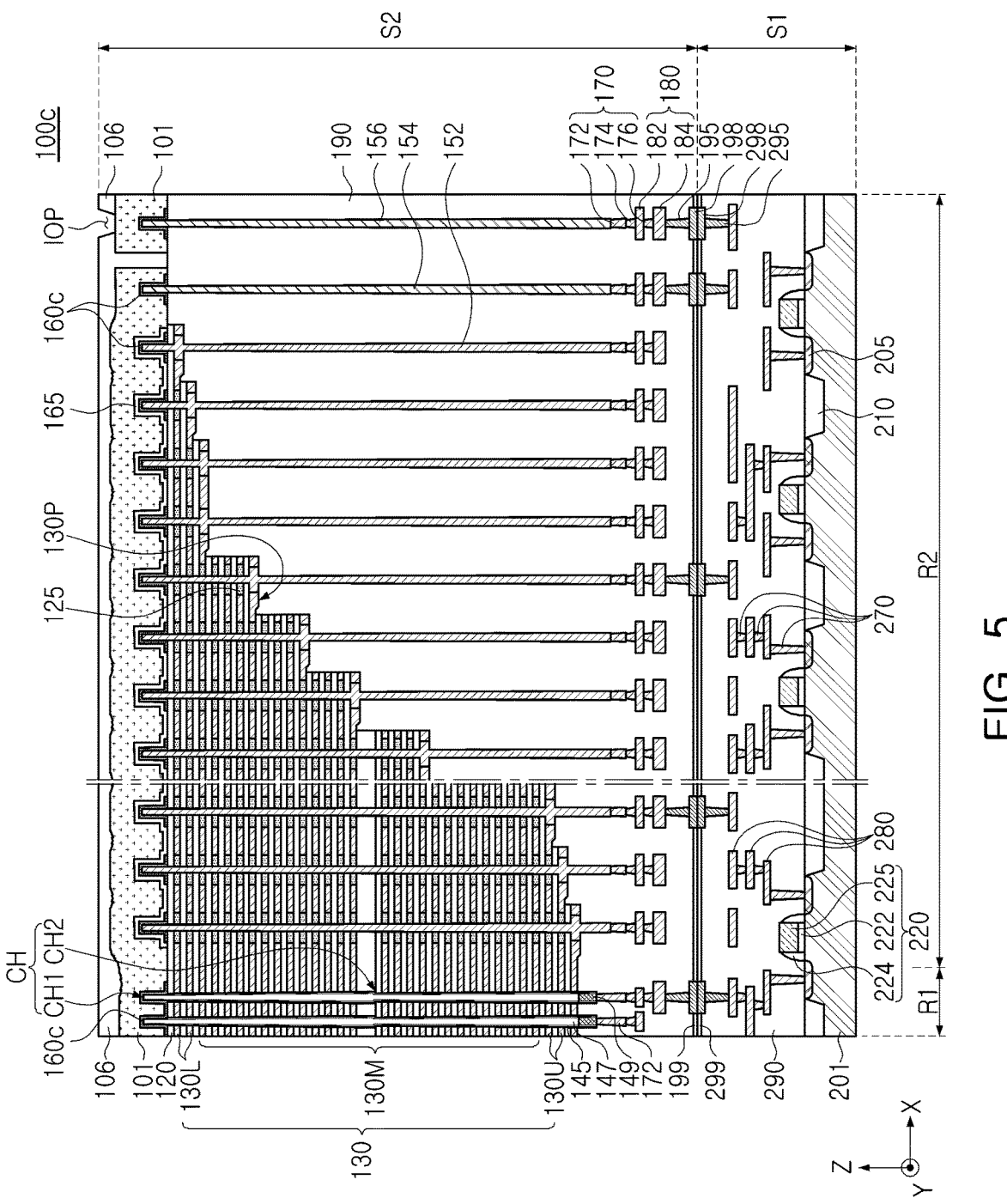
FIG. 5 is a cross-sectional view illustrating at least a portion of an example semiconductor device according to one or more embodiments of the present disclosure.

FIG. 5 is a cross-sectional view illustrating at least a portion of an example semiconductor device 100c according to one or more embodiments.

Referring to FIG. 5, in the semiconductor device 100c, a diffusion barrier 160c may be further disposed on the channel structures CH in the first region R1. The diffusion barrier 160c may cover the upper end of the channel structures CH in the source structure 101. Among the diffusion barriers 160c, the diffusion barrier 160c on the channel structures CH and the diffusion barrier 160c on the first contact plugs 152 may be spaced apart from each other. For example, when the diffusion barriers 160c include a material having relatively high electrical conductivity, the diffusion barriers 160c may be further disposed on the channel structures CH.

Figure 6:
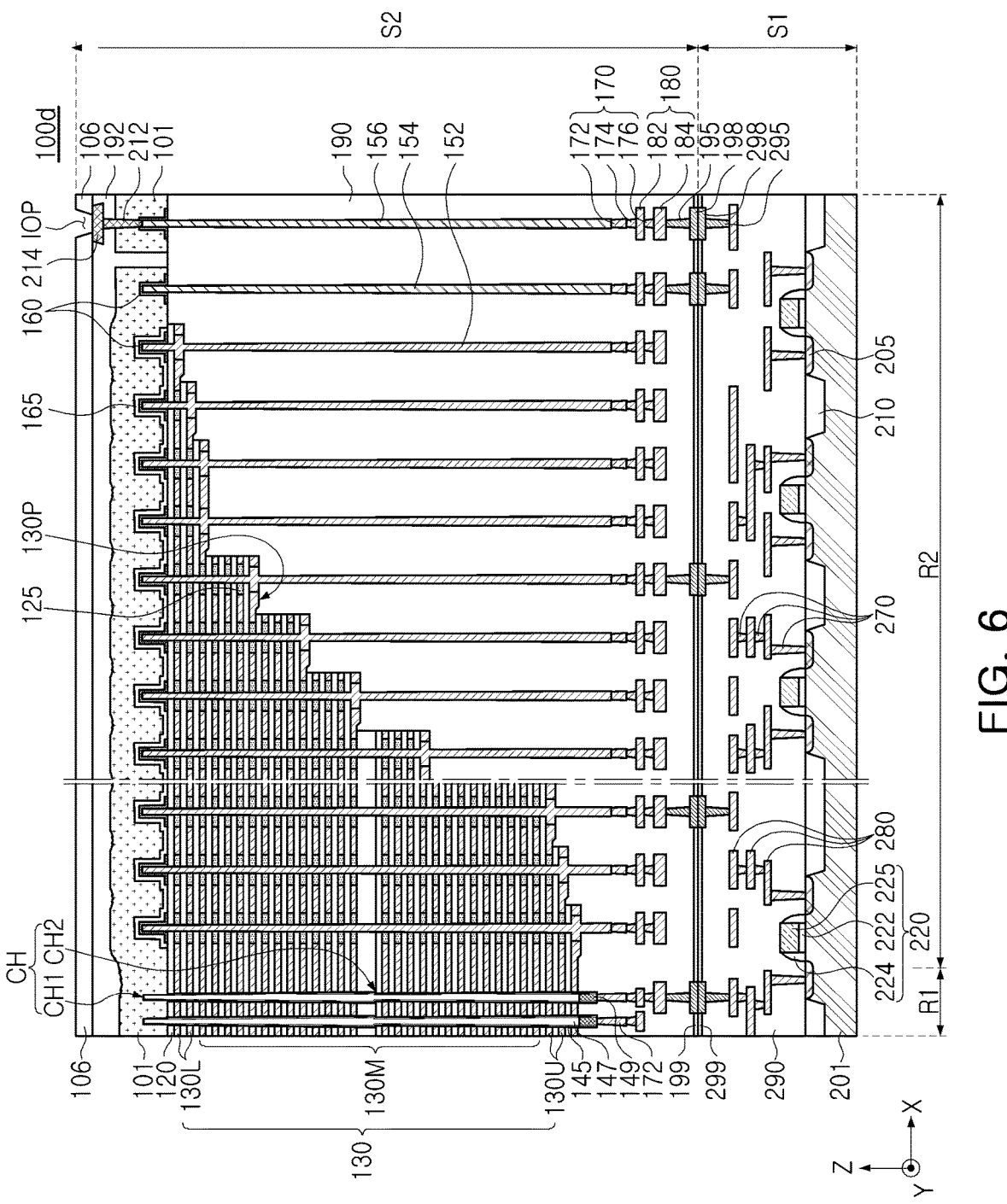
FIG. 6 is a cross-sectional view illustrating at least a portion of an example semiconductor device according to one or more embodiments of the present disclosure.

FIG. 6 is a cross-sectional view illustrating at least a portion of an example semiconductor device 100d, according to one or more embodiments.

Referring to FIG. 6, in the semiconductor device 100d, the second substrate structure S2 may further include input/output vias 212 and an input/output pad 214 disposed in the input/output pad region IOP. The second substrate structure S2 may further include an upper cell region insulating layer 192 disposed between the source structure 101 and the passivation layer 106.

The input/output vias 212 may partially penetrate through the upper cell region insulating layer 192 on the source structure 101 and the source structure 101 and may be connected to an upper end of the third contact plug 156. In example embodiments, a depth of the input/output vias 212 may be varied. In FIG. 6, the input/output vias 212 may penetrate through the diffusion barrier 160 and may be connected to the third contact plug 156, but an example embodiment thereof is not limited thereto. For example, in some example embodiments, the input/output vias 212 may be connected to the diffusion barrier 160 or may be connected to the upper surface of the source structure 101.

The input/output pad 214 may be connected to the input/output vias 212 on the input/output vias 212. A portion of the upper surface of the input/output pad 214 may be exposed through an opening of the passivation layer 106 and may be connected to an external device.

The input/output vias 212 and the input/output pad 214 may include a metal material, for example, tungsten (W), aluminum (Al), copper (Cu), tungsten nitride (WN), tantalum nitride (TaN), titanium nitride (TiN), or a combination thereof.

Figure 7A:
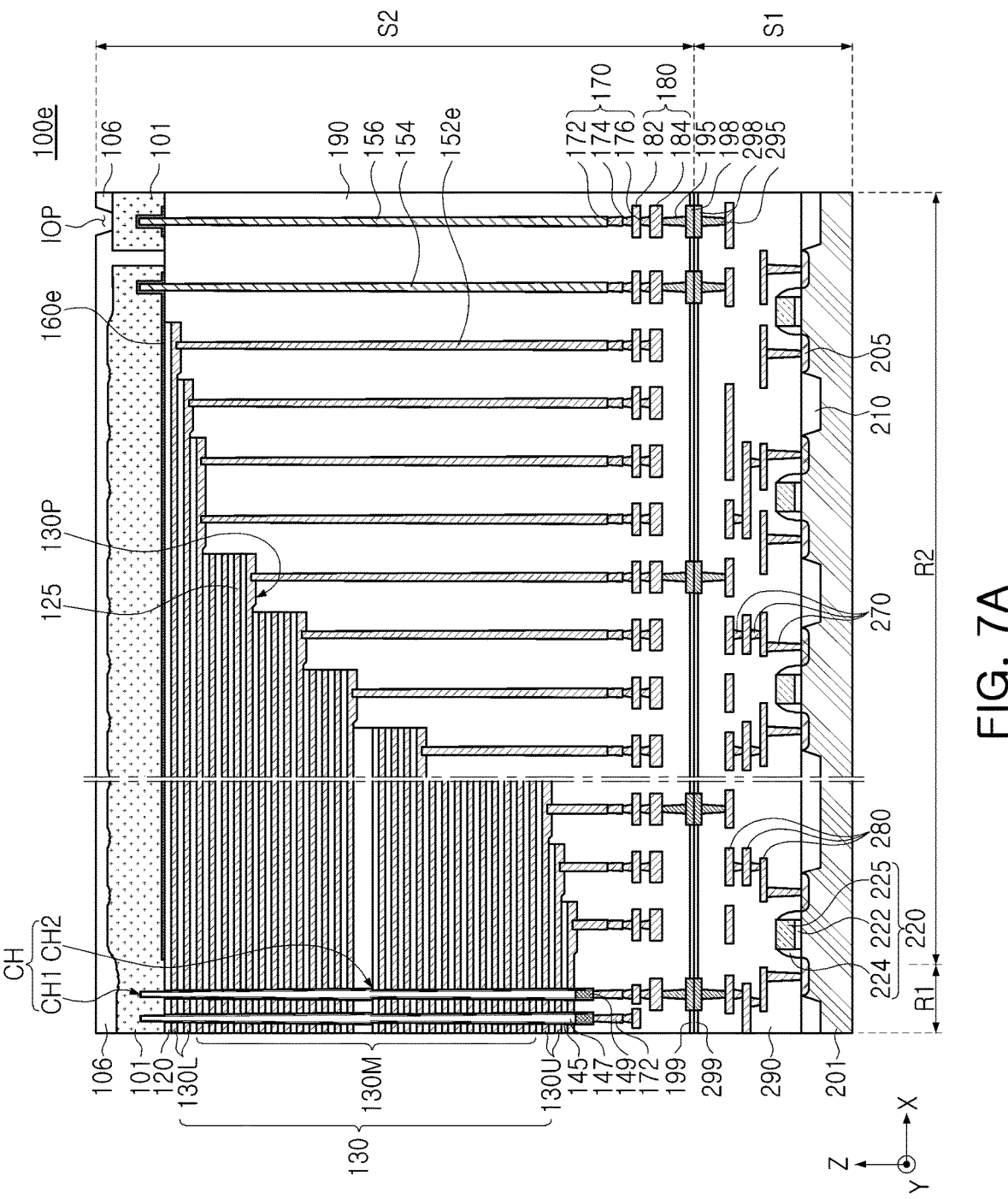
FIGS. 7A and 7B are cross-sectional views illustrating at least a portion of an example semiconductor device according to one or more embodiments of the present disclosure.
Figure 7B:
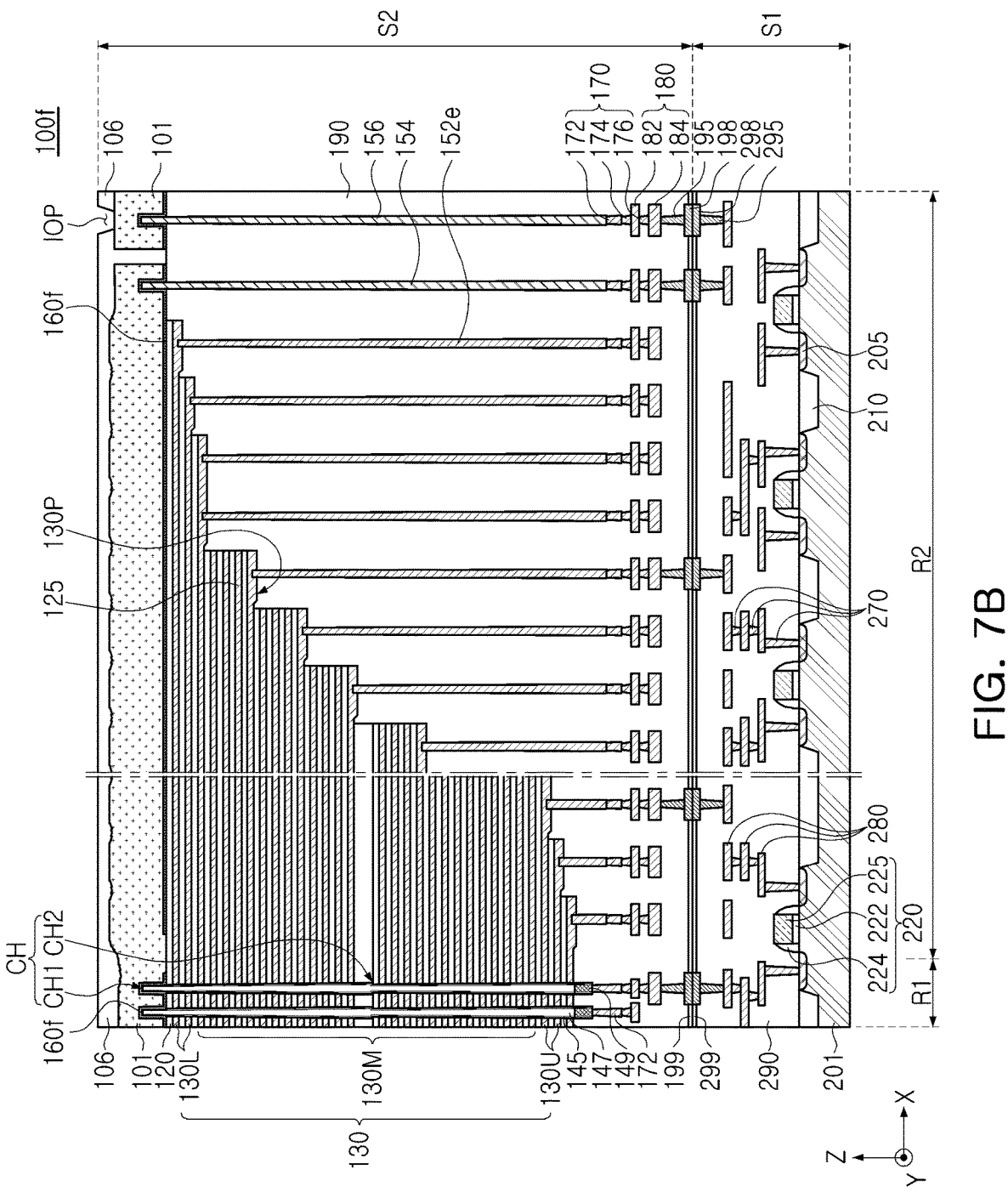

FIGS. 7A and 7B are cross-sectional views illustrating at least a portion of example semiconductor devices 100e and 100f, respectively, according to some embodiments.

Referring to FIG. 7A, in the semiconductor device 100e, first contact plugs 152e may be disposed to be connected only to pad regions 130P without penetrating through gate electrodes 130. Also, the second substrate structure S2 may not include an upper insulating layer 165 (see FIG. 1).

The first contact plugs 152e may be partially recessed into the pad regions 130P by extending downwardly land may be connected to the pad regions 130P. Upper ends of first contact plugs 152e may be disposed in pad regions 130P. In some example embodiments, the upper ends of the first contact plugs 152e may be connected to lower surfaces of the pad regions 130P.

The diffusion barriers 160e may be disposed between the upper ends of the second and third contact plugs 154 and 156 and the source structure 101, and may extend horizontally along the lower surface of the source structure 101 on the pad regions 130P. The range of the region in which the diffusion barriers 160e extend horizontally may be varied in example embodiments.

Referring to FIG. 7B, in the semiconductor device 100f, the arrangement of the first contact plugs 152e and the form of omitting the upper insulating layer 165 (see FIG. 1) may be the same as in the example embodiment in FIG. 7A. However, in this example embodiment, differently from the example embodiment in FIG. 7A, a diffusion barrier 160f may also be disposed in the first region R1. The diffusion barrier 160f may cover upper ends of the channel structures CH protruding into the source structure 101 in the first region R1. The diffusion barrier 160f disposed in the first region R1 may be spaced apart from the diffusion barrier 160f disposed on the second contact plug 154. In example embodiments, a position of a region in which the diffusion barriers 160f are spaced apart from each other and distances therebetween may be varied.

FIGS. 8A to 8H are cross-sectional views illustrating intermediate processes in an example method of manufacturing a semiconductor device, according to one or more embodiments.

Figure 8A:
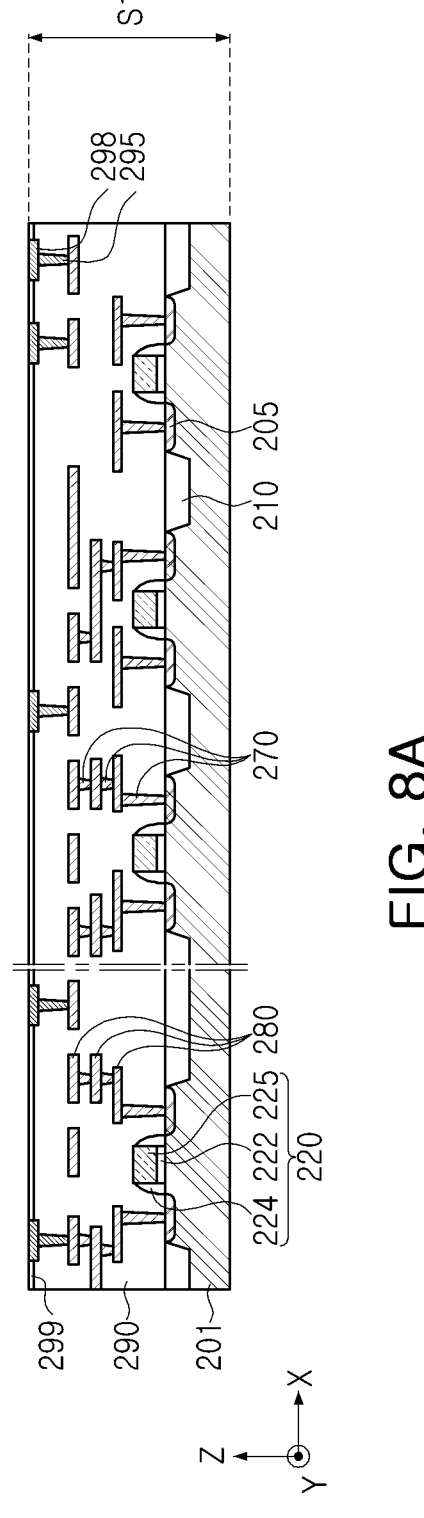
FIGS. 8A to 8H are cross-sectional views illustrating intermediate processes in an example method of manufacturing a semiconductor device according to one or more embodiments of the present disclosure.

Referring to FIG. 8A, a first substrate structure S1 including circuit devices 220, a first interconnection structure, and a first bonding structure may be formed on a substrate 201.

First, device isolation layers 210 may be formed in the substrate 201, and a circuit gate dielectric layer 222 and a circuit gate electrode 225 may be formed in order on the substrate 201. The device isolation layers 210 may be formed by, for example, a shallow trench isolation (STI) process. The circuit gate dielectric layer 222 may be formed of silicon oxide, and the circuit gate electrode 225 may be formed of at least one of polycrystalline silicon, metal silicide, and metal material, but an example embodiment thereof is not limited thereto. Thereafter, a spacer layer 224 and source/drain regions 205 may be formed on both side walls of the circuit gate dielectric layer 222 and the circuit gate electrode 225. Thereafter, the source/drain regions 205 may be formed in the substrate 201 by performing an ion implantation process.

Circuit contact plugs 270 of the first interconnection structure may be formed by forming a portion of a peripheral region insulating layer 290, removing a portion by etching, and filling the removed portion of the peripheral region insulating layer 290 with a conductive material. Circuit interconnection lines 280 of the first interconnection structure may be formed by, for example, depositing a conductive material and patterning the material.

Thereafter, a first bonding insulating layer 299 may be formed on the circuit interconnection lines 280 and an upper surface of the peripheral region insulating layer 290. First bonding vias 295 and first bonding pads 298 of the second bonding structure may be formed after partially removing the first bonding insulating layer 299 and the peripheral region insulating layer 290.

By this process, the first substrate structure S1 may be prepared.

Figure 8B:
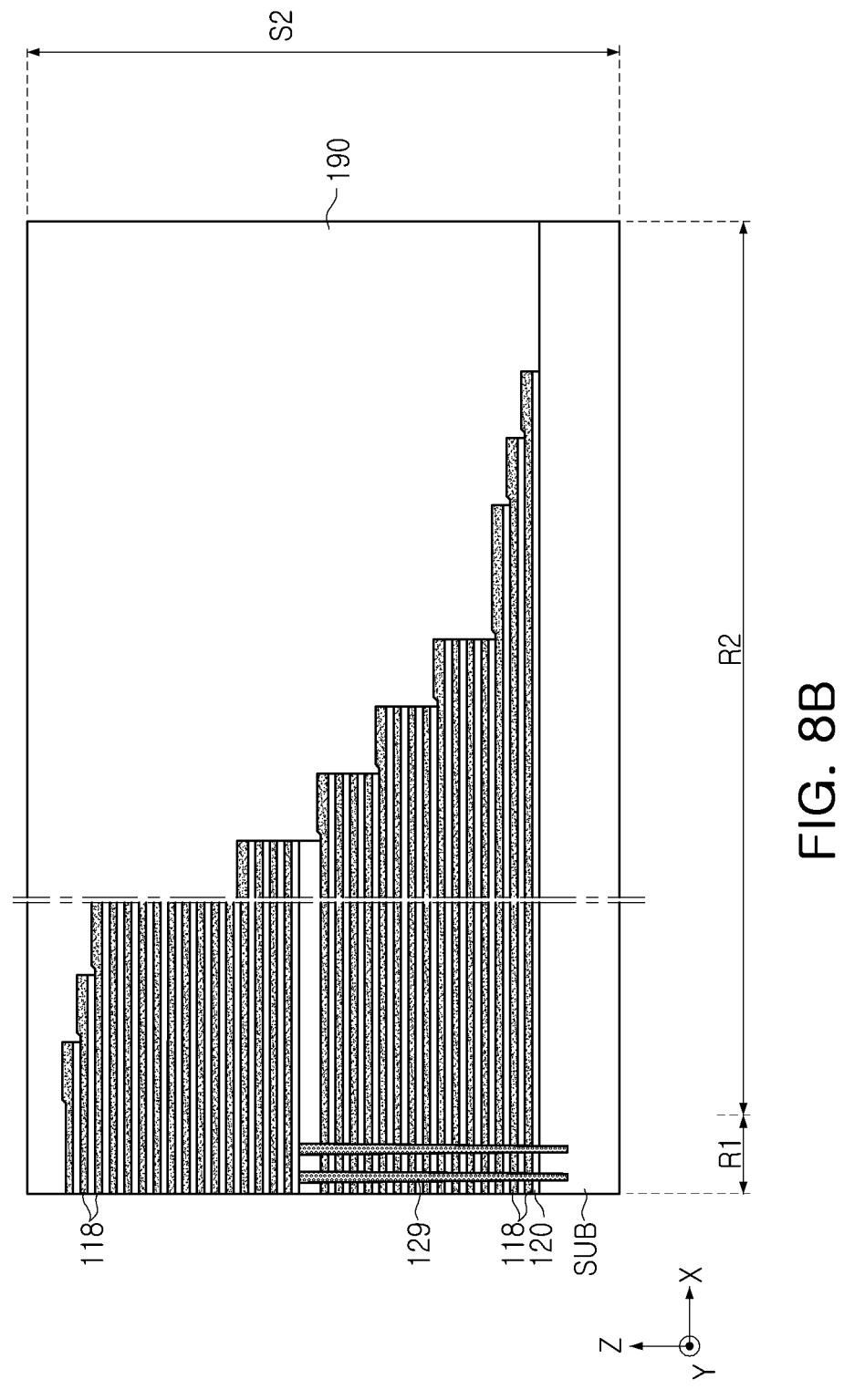

Referring to FIG. 8B, a process of manufacturing the second substrate structure S2 may start. First, sacrificial insulating layers 118 and interlayer insulating layers 120 may be alternately stacked on a base substrate SUB in a vertical direction (i.e., Z-direction), and vertical sacrificial layers 129 may be formed. The vertical sacrificial layers 129 may be extend in the Z-direction through at least a subset of the sacrificial insulating layers 118 and interlayer insulating layers 120, passing partially into the base substrate SUB.

The base substrate SUB may be removed through a subsequent process, and may be a semiconductor substrate such as undoped silicon Si.

Thereafter, to first form a lower stack structure, in the region in which the first channel structures CH1 (see FIG. 1) are disposed, the sacrificial insulating layers 118 and the interlayer insulating layers 120 may be alternately stacked. The sacrificial insulating layers 118 may be replaced with the gate electrodes 130 (see FIG. 1) by a subsequent process. The sacrificial insulating layers 118 may be formed of a material etched with etch selectivity for the interlayer insulating layers 120. For example, the interlayer insulating layer 120 may be formed of at least one of silicon oxide and silicon nitride, and the sacrificial insulating layers 118 may be formed of a material different from that of the interlayer insulating layer 120 selected from silicon, silicon oxide, silicon carbide, and silicon nitride. In example embodiments, the thickness of the interlayer insulating layers 120 and the number of layers included therein may be varied from the illustrated example.

Thereafter, in the second region R2, a photolithography process and an etching process may be repeatedly performed on the sacrificial insulating layers 118 and the interlayer insulating layers 120 such that the upper sacrificial insulating layers 118 may extend shorter than the lower sacrificial insulating layers 118. Accordingly, the sacrificial insulating layers 118 may form a staircase shape. In example embodiments, the sacrificial insulating layers 118 may be formed to have a relatively thick thickness on the end (opposing the first region R1), and a process therefor may be further performed. Thereafter, a portion of the cell region insulating layer 190 covering the lower stack structure of the sacrificial insulating layers 118 and the interlayer insulating layers 120 may be formed.

The vertical sacrificial layers 129 may be formed by forming lower channel holes to penetrate through the lower stack structure in a region corresponding to the first channel structures CH1, and depositing the vertical sacrificial layers 129 material in the lower channel holes. The vertical sacrificial layers 129 may include, for example, polycrystalline silicon.

An upper stack structure may be formed on the lower stack structure in the same manner as the lower stack structure. Thereafter, upper channel holes (above and aligned in an X- and Y-direction with the vertical sacrificial layers 129) may be formed to penetrate through the upper stack structure, and the vertical sacrificial layers may be further formed in the region corresponding to the second channel structures CH2 (see FIG. 1).

In some example embodiments, in this process, vertical sacrificial layers may also be formed in regions corresponding to the first to third contact plugs 152, 154, and 156 in FIG. 1.

Figure 8C:
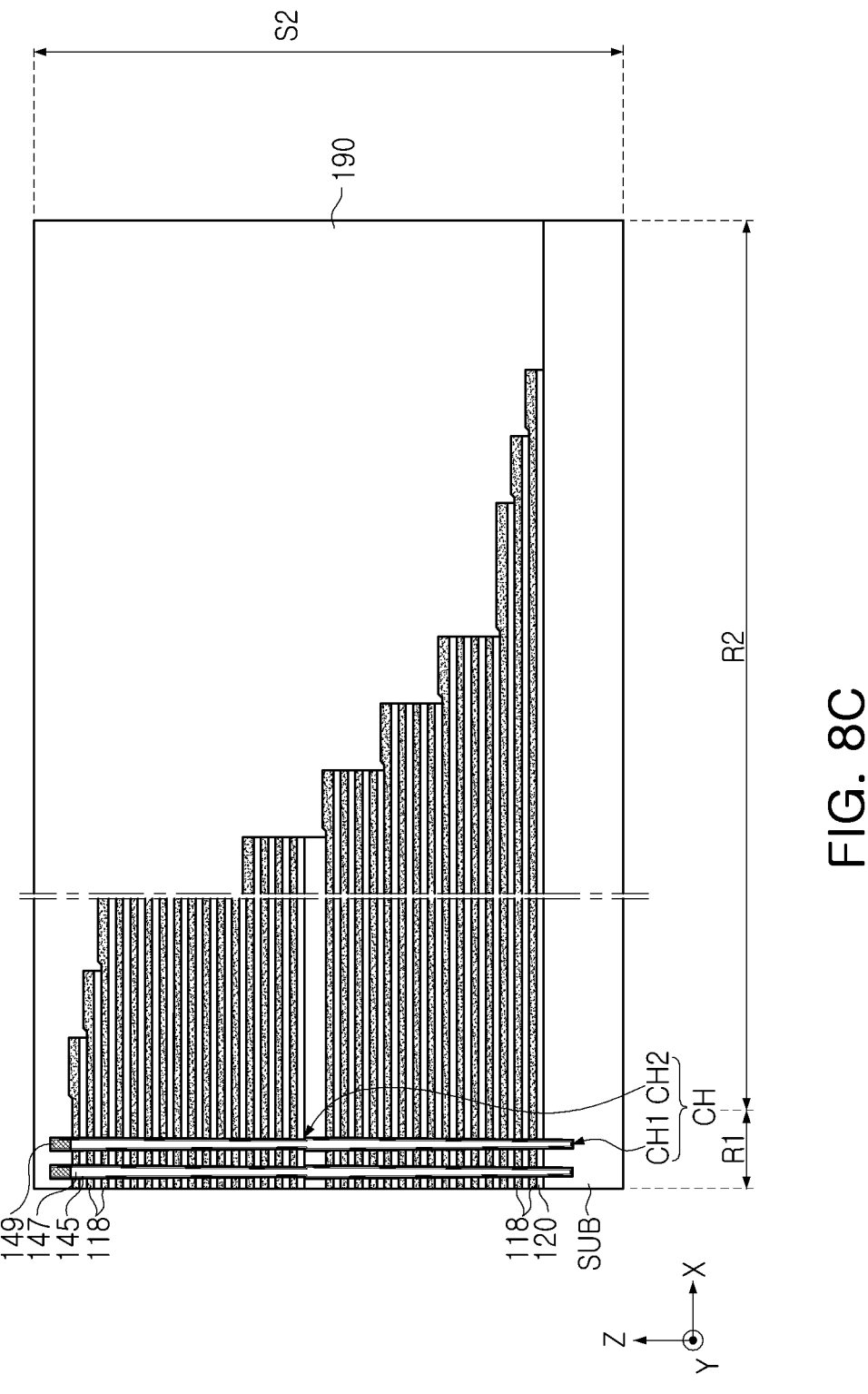

Referring to FIG. 8C, channel structures CH penetrating through the stack structure of sacrificial insulating layers 118 and the interlayer insulating layers 120 may be formed.

First, channel holes may be formed by removing the vertical sacrificial layers 129, such by performing a selective etching process. Thereafter, a gate dielectric layer 145, a channel layer 140 (see FIG. 2B), a channel buried insulating layer 147, and a channel pad 149 may be formed in order in the channel holes and the channel structures CH, including first and second channel structures CH1 and CH2, may be formed. The channel layer 140 may be formed on the gate dielectric layer 145 in the channel structures CH (see FIG. 2B). The channel buried insulating layer 147 may be formed to fill the channel structures CH and may be an insulating material. However, in example embodiments, the space between the channel layers 140 may be filled with a conductive material instead of the channel buried insulating layer 147. The channel pads 149 may be formed of a conductive material, for example, polycrystalline silicon.

Figure 8D:
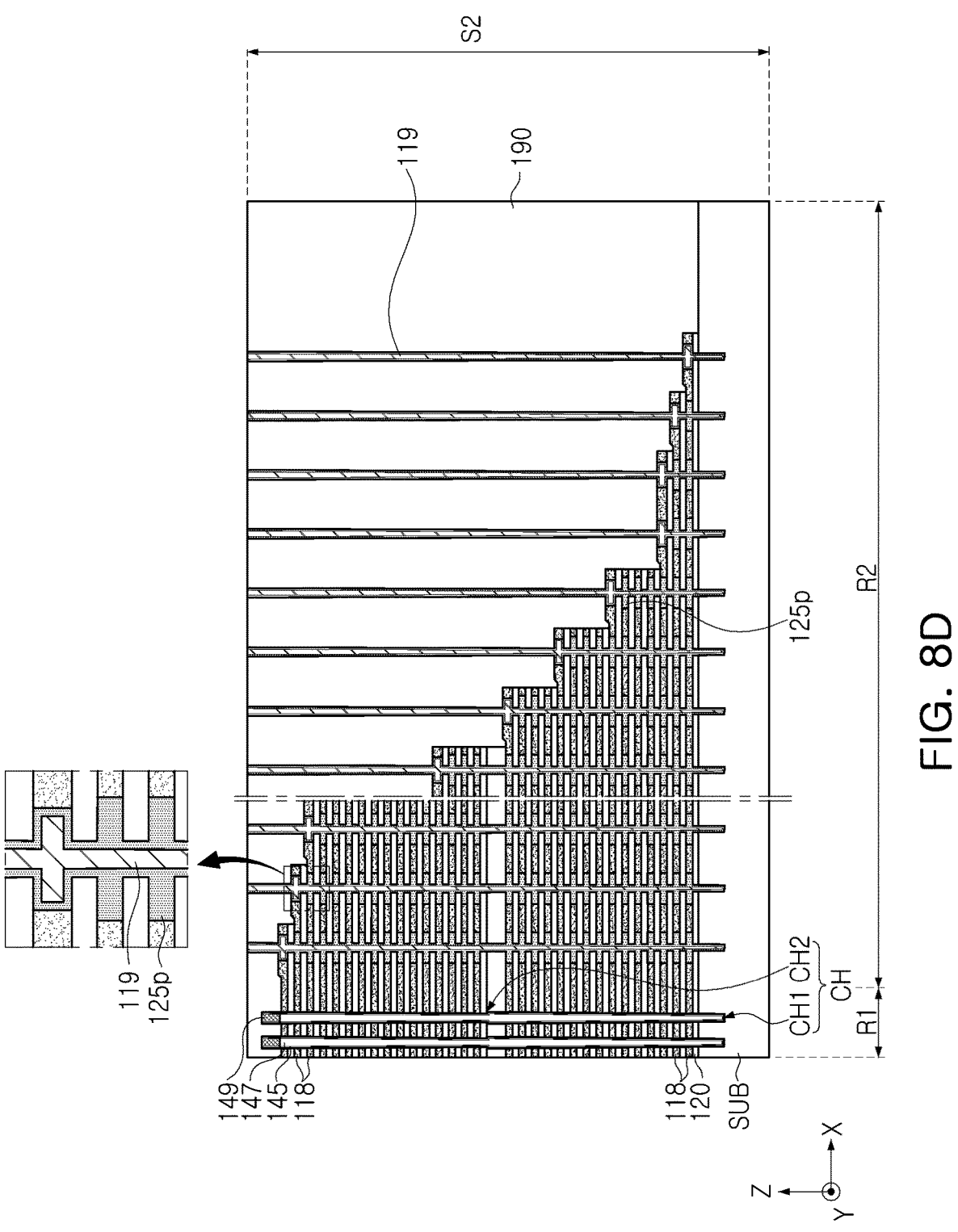

Referring to FIG. 8D, preliminary contact insulating layers 125p and contact sacrificial layers 119 may be formed.

First, contact holes may be formed in regions in which the first contact plugs 152 (see FIG. 1) are formed using a mask layer. In some example embodiments, when vertical sacrificial layers are formed in regions corresponding to the first contact plugs 152, the contact holes may be formed by removing the vertical sacrificial layers. Thereafter, a portion of the sacrificial insulating layers 118 exposed through the contact holes may be removed. Tunnel portions may be formed by removing the sacrificial insulating layers 118 to a predetermined length around the contact holes. The tunnel portions may be formed to have a relatively short length in the uppermost sacrificial insulating layers 118 and to have a relatively long length in the lower sacrificial insulating layers 118.

The preliminary contact insulating layers 125p may be formed by depositing an insulating material in the contact holes and the tunnel portions. The preliminary contact insulating layers 125p may be formed on side walls of the contact holes and may fill the tunnel portions. In the uppermost sacrificial insulating layers 118, the preliminary contact insulating layers 125p may not completely fill the tunnel portions.

The contact sacrificial layers 119 may be formed on the preliminary contact insulating layers 125p and may fill the contact holes and the uppermost tunnel portions. The contact sacrificial layers 119 may include a material different from that of the preliminary contact insulating layers 125p, and may include, for example, polycrystalline silicon.

Figure 8E:
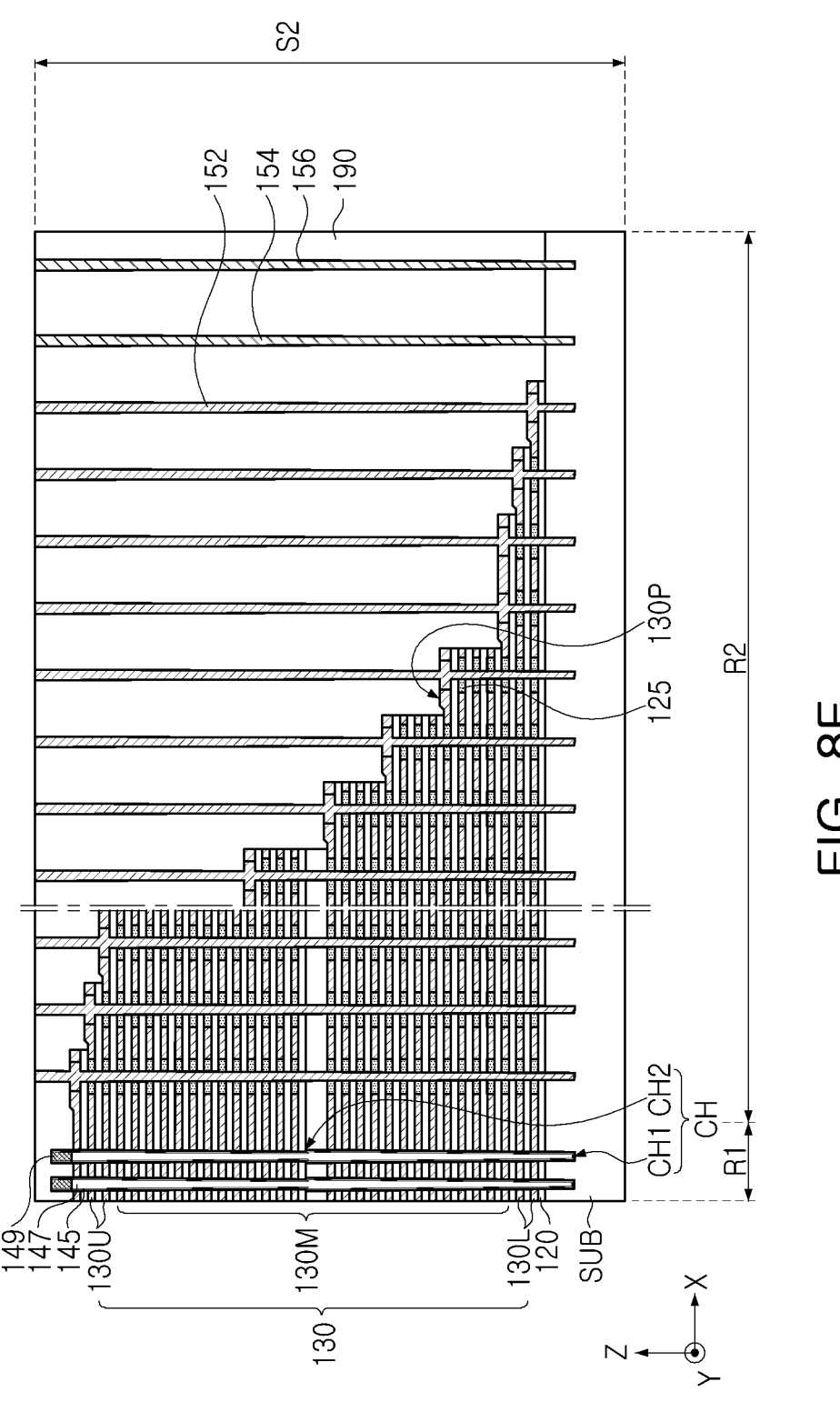

Referring to FIG. 8E, the sacrificial insulating layers 118 may be removed, gate electrodes 130 may be formed, and first to third contact plugs 152, 154, and 156 may be formed.

First, openings penetrating through the sacrificial insulating layers 118 and the interlayer insulating layers 120 and extending vertically (i.e., in the Z-direction) to the source structure 101 may be formed, and the sacrificial insulating layers 118 may be removed by supplying an etchant, selective to the material being etched, through the openings. The sacrificial insulating layers 118 may be selectively removed with respect to the interlayer insulating layers 120 and the preliminary contact insulating layers 125p using, for example, wet etching.

The gate electrodes 130 may be formed by depositing a conductive material in regions from which the sacrificial insulating layers 118 are removed. The conductive material may include, for example, a metal, polycrystalline silicon or metal silicide material. In some example embodiments, a portion of the gate dielectric layer 145 may be formed preferentially before forming the gate electrodes 130. After forming the gate electrodes 130, an insulating material may be deposited in the openings.

Thereafter, the first contact plugs 152 may be formed by removing the contact sacrificial layers 119 from the contact holes and depositing a conductive material therein. The contact sacrificial layers 119 may be selectively removed with respect to the interlayer insulating layers 120 and the gate electrodes 130. After the contact sacrificial layers 119 are removed, a portion of the exposed preliminary contact insulating layers 125p (FIG. 8D) may also be removed. In this case, the entirety of the preliminary contact insulating layers 125p may be removed in the pad regions 130P, and the preliminary contact insulating layers 125p (FIG. 8D) may remain therebelow and may form contact insulating layers 125. In the pad regions 130P, when the gate dielectric layer 145 is exposed after removing the preliminary contact insulating layers 125p (FIG. 8D), the gate dielectric layer 145 may also be removed to expose side surfaces of the gate electrodes 130. The first contact plugs 152 may be formed to have regions extending horizontally in the pad regions 130P, and may be physically and electrically connected to the gate electrodes 130 by the regions.

The second and third contact plugs 154 and 156 may be formed by forming separate contact holes extending from the external side of the gate electrodes 130 through the cell region insulating layer 190 partially into the base substrate SUB, and depositing a conductive material in the contact holes. The process of depositing the conductive material may be performed simultaneously with the process of depositing the first contact plugs 152, but an example embodiment thereof is not limited thereto.

Figure 8F:
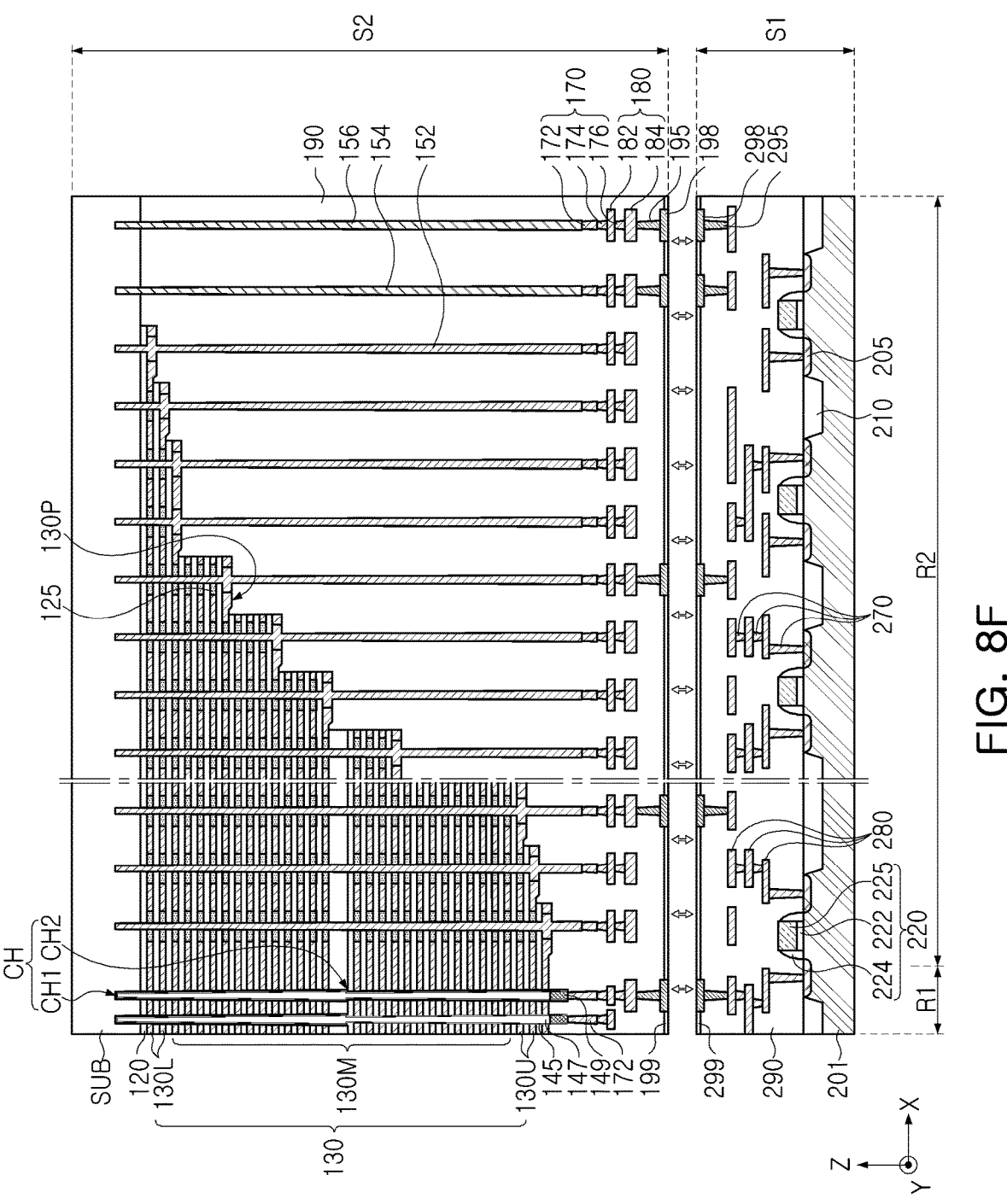

Referring to FIG. 8F, a second interconnection structure and a second bonding structure may be formed on the gate electrodes 130, and the first substrate structure S1 and the second substrate structure S2 may be bonded to each other.

In the second interconnection structure, cell contact plugs 170 may be formed by etching the cell region insulating layer 190 and depositing a conductive material on the channel pads 149 and first to third contact plugs 152, 154, and 156. Cell interconnection lines 180 may be formed through a process of depositing and patterning a conductive material, or may be formed by partially forming the cell region insulating layer 190, patterning the layer, and depositing a conductive material thereon.

In the second bonding structure, a second bonding insulating layer 199 may be formed on the cell region insulating layer 190. Thereafter, the second bonding insulating layer 199 and the cell region insulating layer 190 may be partially removed in selected areas (e.g., by patterning and etching), a conductive material may be deposited, thereby forming second bonding vias 195, and second bonding pads 198 may be formed on the second bonding vias 195. In some example embodiments, the second bonding vias 195 and the second bonding pads 198 disposed vertically (i.e., in the Z-direction) may be integrated with each other. Upper surfaces of the second bonding pads 198 may be exposed from the cell region insulating layer 190.

Thereafter, the first substrate structure S1 and the second substrate structure S2 may be connected to each other by bonding the first bonding pads 298 to the second bonding pads 198, for example by annealing and/or pressing. Simultaneously, the first bonding insulating layer 299 and the second bonding insulating layer 199 may also be bonded to each other. The second substrate structure S2 may be disposed upside down on the first substrate structure S1 such that the second bonding pads 198 may be oriented toward the lower portion, such that the second bonding pads 198 are facing and at least partially aligned with (in the X- and/or Y-direction) corresponding first bonding pads 298, and bonding may be performed. In the drawings, for ease of description, the second substrate structure S2 may be bonded in the form of a mirror image of the structure illustrated in FIG. 8E. The first substrate structure S1 and the second substrate structure S2 may be directly bonded to each other without interposing an adhesive such as an adhesive layer.

Figure 8G:
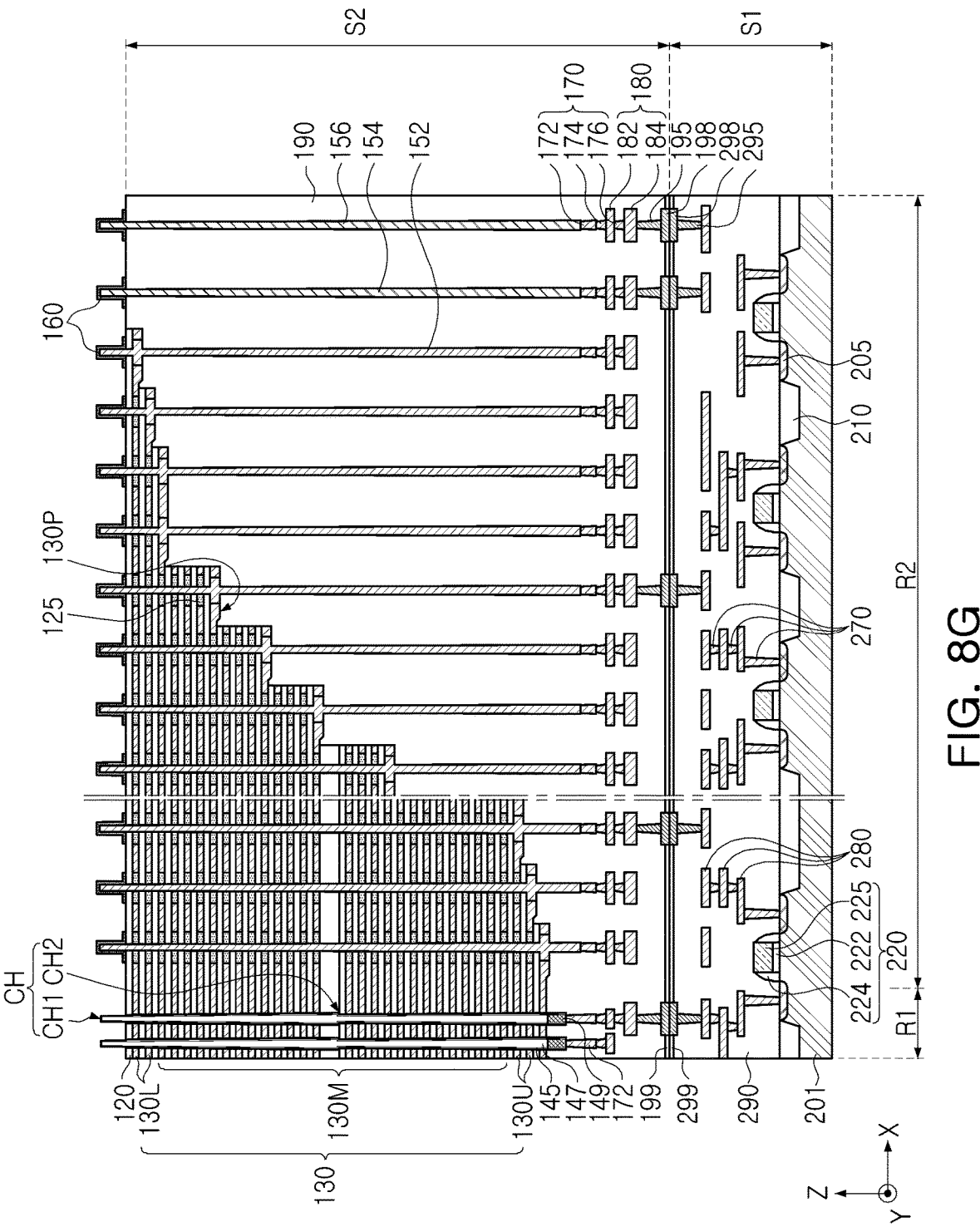

Referring to FIG. 8G, on the bonding structure of the first and second substrate structures S1 and S2, the base substrate SUB may be removed and the diffusion barriers 160 may be formed.

For example, a portion of the base substrate SUB of the second substrate structure S2 may be removed from the upper surface by a polishing process such as a grinding process (e.g., CMP or the like), and the remaining portion may be removed by an etching process such as wet etching. By removing the base substrate SUB of the second substrate structure S2, the overall thickness of the semiconductor device may be reduced. By removing the base substrate SUB, the upper ends of the channel structures CH and the first to third contact plugs 152, 154, and 156 may be exposed. The channel dielectric layers 145 (see FIG. 2B) may be removed from the upper ends of the exposed channel structures CH.

The diffusion barriers 160 may be formed by patterning on the exposed channel structures CH and upper ends of the first to third contact plugs 152, 154, and 156.

Figure 8H:
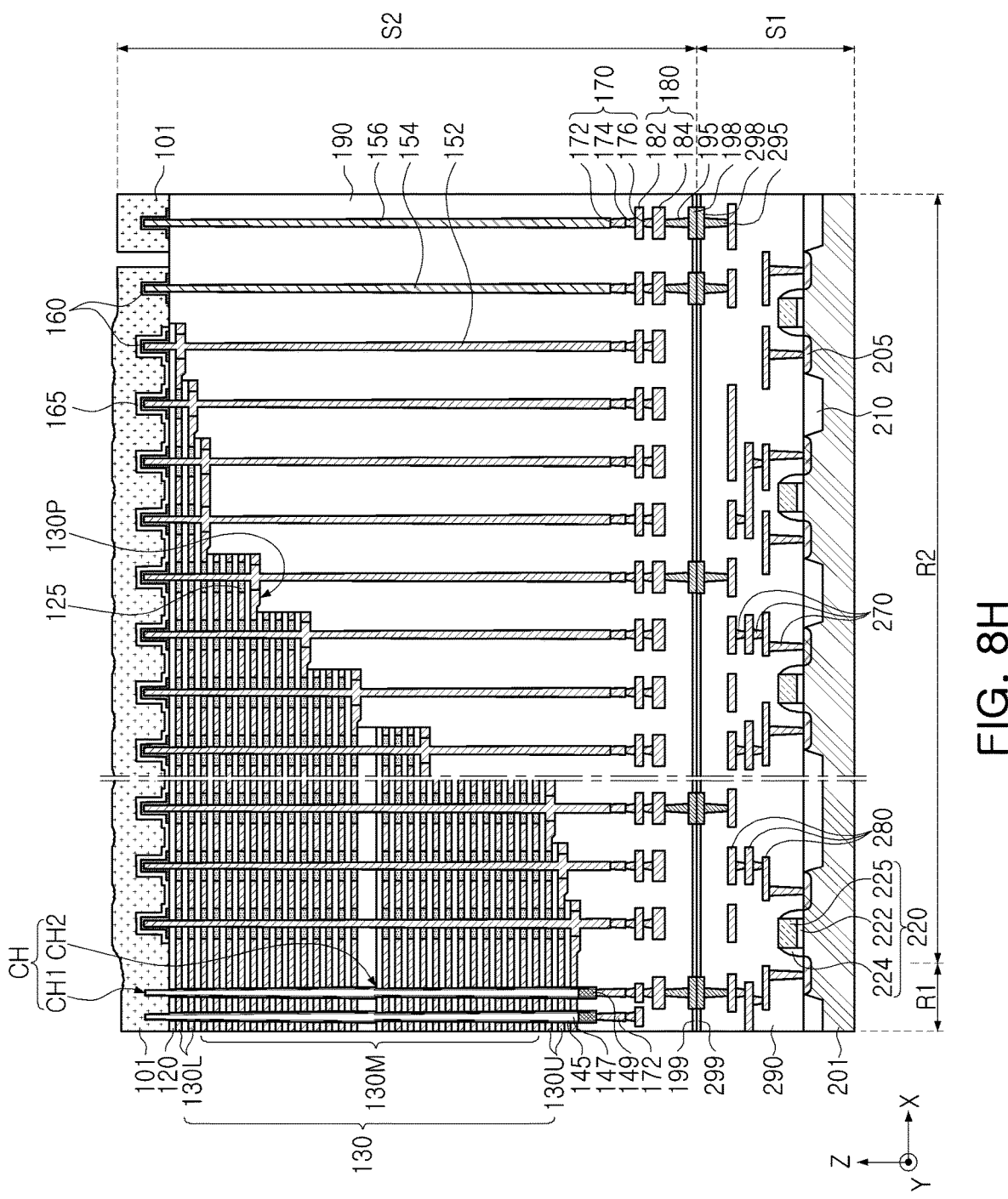

Referring to FIG. 8H, an upper insulating layer 165 may be formed on a portion of the diffusion barriers 160, and a source structure 101 may be formed.

The upper insulating layer 165 may be formed by depositing and patterning an insulating material on the diffusion barriers 160 on the first contact plugs 152.

The source structure 101 may be formed by depositing and crystallizing a semiconductor material in an amorphous state, for example, amorphous silicon Si. The crystallization process may be, for example, a laser annealing process. When the diffusion barriers 160 are not formed, the metal material included in the first to third contact plugs 152, 154, and 156 may be mixed with a semiconductor material of the source structure 101 during the crystallization process, or the metal material may act as a catalyst such that a defect in which the semiconductor material is non-uniformly crystallized locally may occur. As in the example embodiment, the above issues may be prevented by forming the diffusion barriers 160 formed of a material having a melting point higher than the melting point of amorphous silicon and higher than the crystallization process temperature.

The upper surface of the source structure 101 may have curvatures corresponding to the channel structures CH and the first to third contact plugs 152, 154, and 156, but an example embodiment thereof is not limited thereto. In example embodiments, the degree of the curvature may be varied.

Thereafter, referring to FIG. 1 together, a passivation layer 106 having an opening for accessing an input/output pad region IOP may be formed on the upper surface of the source structure 101, thereby manufacturing the semiconductor device 100 in FIG. 1.

Figure 9:
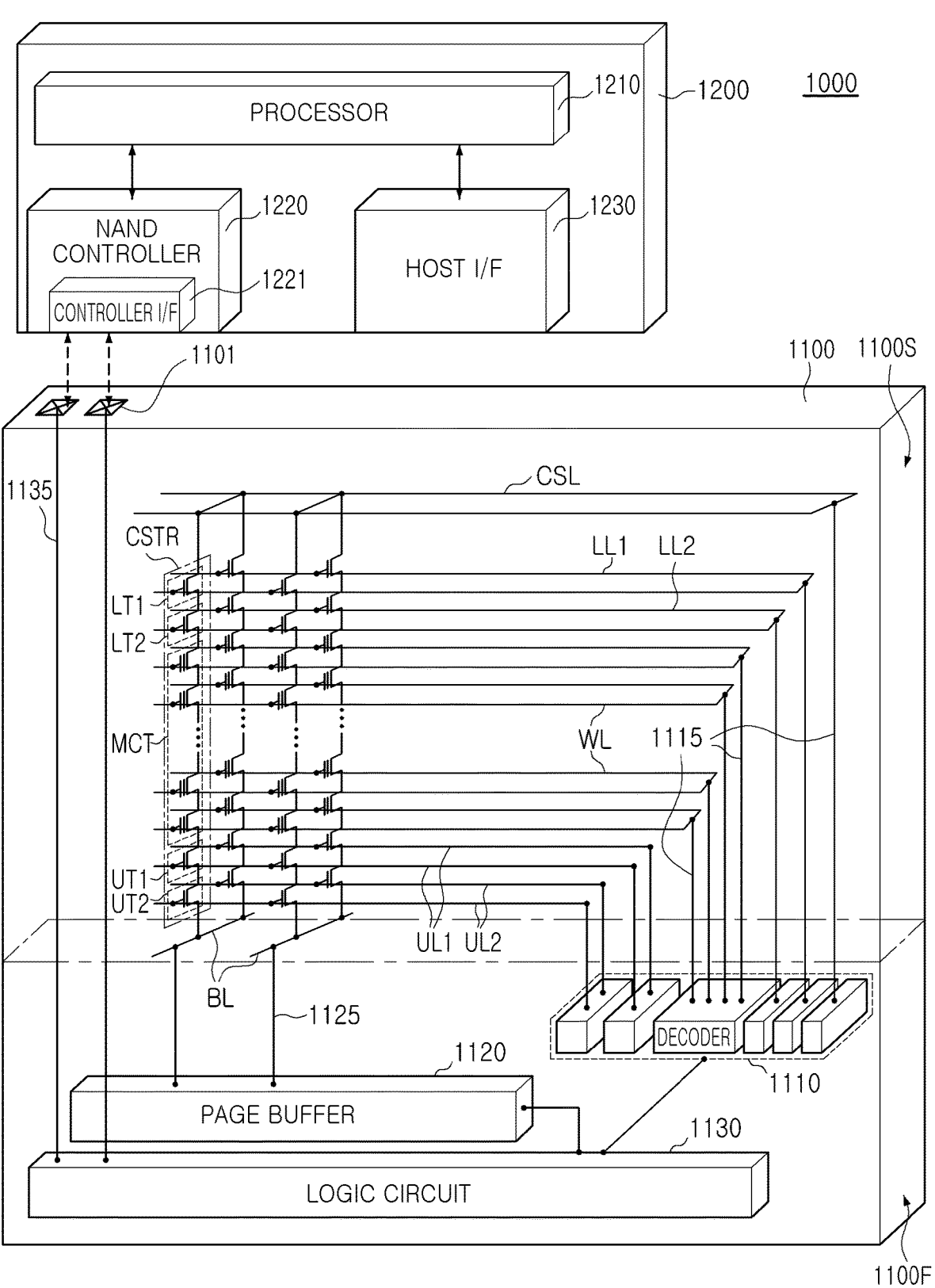
FIG. 9 is a view illustrating a data storage system including at least a portion of an example semiconductor device according to one or more embodiments of the present disclosure.

FIG. 9 is a conceptual view illustrating at least a portion of an example data storage system 1000 including a semiconductor device according to an illustrative embodiment.

Referring to FIG. 9, the data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiments with reference to FIGS. 1 to 7B. The semiconductor device 1100 may include a first structure 1100F and a second structure 1100S on the first structure 1100F. In the example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including one or more bit lines BL, a common source line CSL, word lines WL, first and second gate upper lines UL1 and UL2, first and second gate lower lines LL1 and LL2 and memory cell strings CSTR disposed between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the corresponding bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in the example embodiments, and embodiments of the present disclosure are not limited thereto.

In the example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In the example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F to the second structure 1100S. The bit lines BL may be electrically connected to the page buffer 1120 through second connection interconnections 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through one or more input/output pads 1101 electrically connected to the logic circuit 1130. The input/output pads 1101 may be electrically connected to the logic circuit 1130 through an input/output connection line 1135 extending from the first structure 1100F to the second structure 1100S.

The controller 1200 may include a processor 1210, a NAND controller 1220, and a host interface (I/F) 1230. In the example embodiments, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a controller interface 1221 configured for processing communications with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host (not explicitly shown, but implied). When a control command from an external host is received through the host interface 1230, the processor 1210 may control the semiconductor device 1100 in response to the control command.

Figure 10:
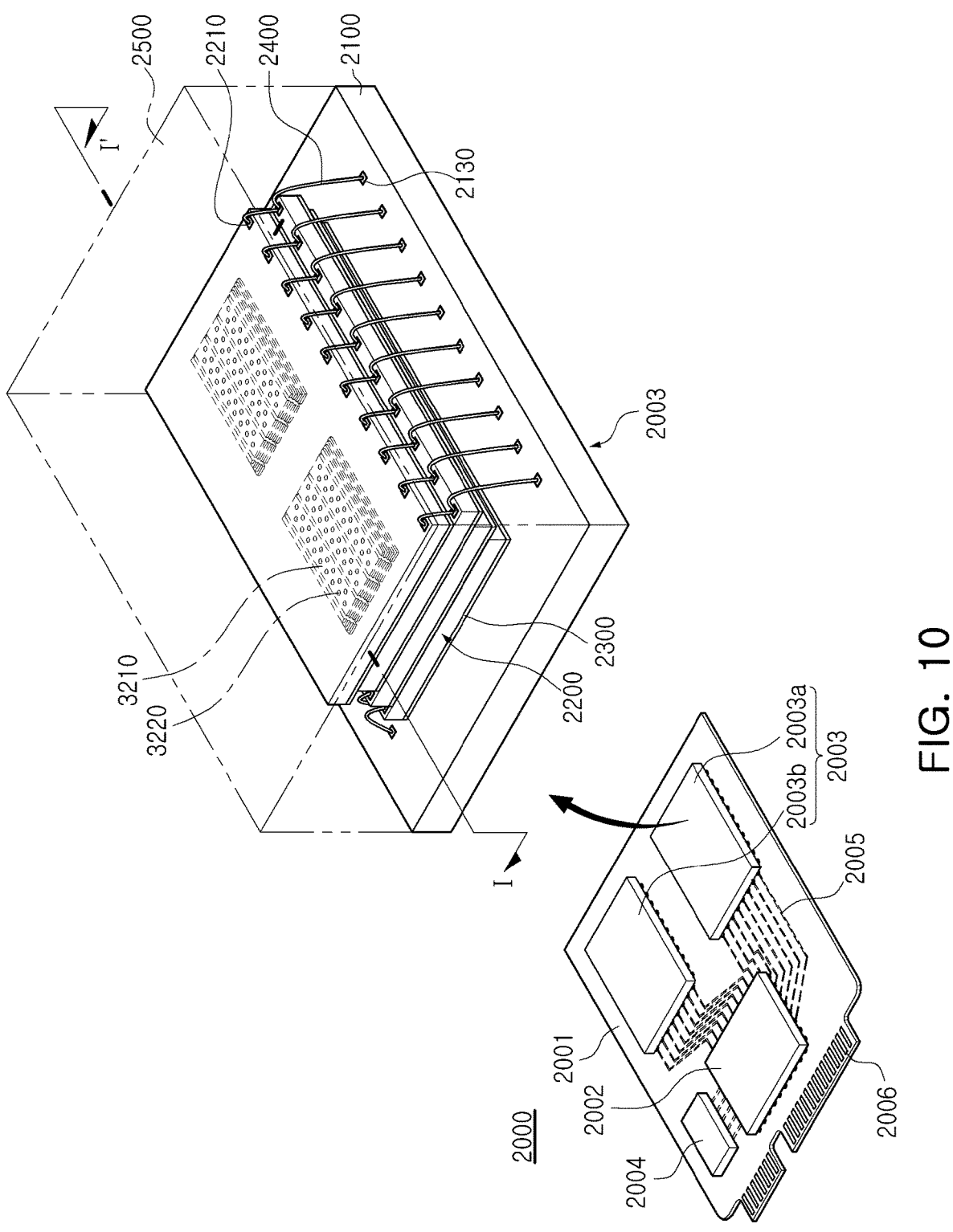
FIG. 10 is a perspective view illustrating a data storage system including a semiconductor device according to an example embodiment of the present disclosure.

FIG. 10 is a perspective view illustrating at least a portion of an example data storage system 2000 including a semiconductor device according to one or more embodiments.

Referring to FIG. 10, the data storage system 2000 in an example embodiment may include a main board 2001 and, disposed on the main board 2001, a controller 2002, one or more semiconductor packages 2003, and a DRAM 2004. The semiconductor package(s) 2003 and the DRAM 2004 may be connected to the controller 2002 by interconnection patterns 2005 formed on the main board 2001.

The main board 2001 may include a connector 2006 including a plurality of pins adapted to be coupled to an external host (not explicitly shown). The number and arrangement of the plurality of pins in the connector 2006 may vary depending on a communication interface between the data storage system 2000 and the external host. In the example embodiments, the data storage system 2000 may communicate with an external host according to one of various standard or proprietary interfaces, including, but not limited to, universal serial bus (USB), peripheral component interconnect express (PCI-Express), serial advanced technology attachment (SATA), M-Phy for universal flash storage (UFS), among other communication interfaces. In the example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package(s) 2003.

The controller 2002 may write data to or may read data from the semiconductor package(s) 2003, and may improve an operating speed of the data storage system 2000.

The DRAM 2004 may be configured as a buffer memory for alleviating a difference in speeds between the semiconductor package(s) 2003, which is a data storage space, and an external host. In some embodiments, the DRAM 2004 included in the data storage system 2000 may operate as a cache memory, and may provide a space for temporarily storing data in a control operation for the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package(s) 2003 may include first and second semiconductor packages 2003*a* and 2003*b* spaced apart from each other on the main board 2001. Each of the first and second semiconductor packages 2003*a* and 2003*b* may be configured as a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include one or more input/output pads 2210. The input/output pads 2210 may correspond to the input/output pads 1101 in FIG. 9. Each of the semiconductor chips 2200 may include gate stack structures 3210 and channel structures 3220. Each of the semiconductor chips 2200 may include the semiconductor device described in the aforementioned example embodiments with reference to FIGS. 1 to 7B.

In the example embodiments, the connection structure 2400 may be configured as a bonding wire electrically connecting the input/output pads 2210 to corresponding package upper pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. In the example embodiments, in each of the first and second semiconductor packages 2003*a* and 2003*b*, the semiconductor chips 2200 may be electrically connected to each other by a connection structure including, for example, a through-electrode (e.g., a through-silicon via (TSV)) instead of the connection structure 2400 of a bonding wire method.

In the example embodiments, the controller 2002 and the semiconductor chips 2200 may be integrated together in a single package. In an example embodiment, the controller 2002 and the semiconductor chips 2200 may be disposed on an interposer substrate different from the main board 2001, and the controller 2002 and the semiconductor chips 2200 may be connected to each other by an interconnection formed on the interposer substrate.

Figure 11:
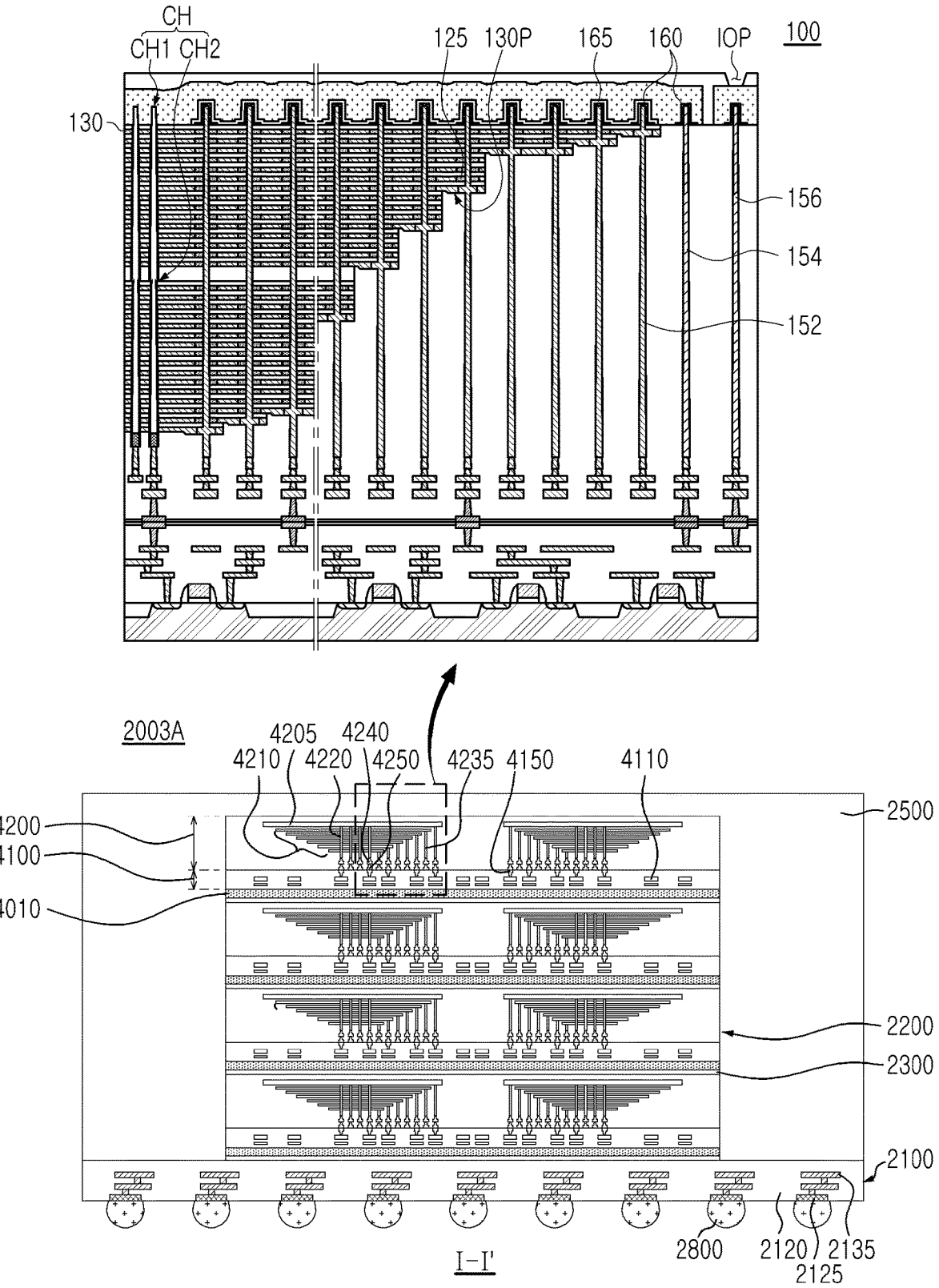
FIG. 11 is a cross-sectional view illustrating at least a portion of an example semiconductor package according to one or more embodiments of the present disclosure.

FIG. 11 is a cross-sectional view illustrating at least a portion of an example semiconductor package according to one or more embodiments, illustrating an example embodiment of the semiconductor package 2003 in FIG. 10 taken along line I-I'.

Referring to FIG. 11, in the semiconductor package 2003A, the package substrate 2100 may be a printed circuit board. The package substrate 2100 includes a package substrate body 2120, package upper pads 2130 (see FIG. 10), package lower pads 2125 disposed on or exposed through a lower surface of the package substrate body 2120, and internal interconnections 2135 electrically connecting the package upper pads 2130 and the package lower pads 2125 inside the package substrate body 2120. The package lower pads 2125 may be connected to the interconnection patterns 2005 of the main board 2001 of the data storage system 2000 as shown in FIG. 10 through conductive connection parts 2800 (e.g., solder balls, ball grid array (BGA), micro-bumps, controlled collapse chip connection (C4), under bump metallurgy (UBM), etc.).

In the semiconductor package 2003A, each of the semiconductor chips 2200 may include a semiconductor substrate 4010, a first structure 4100 on the semiconductor substrate 4010, and a second structure 4200 which may be bonded to the first structure 4100 using, for example, a wafer bonding method on the first structure 4100 (or another bonding scheme).

The first structure 4100 may include a peripheral circuit region including a peripheral interconnection 4110 and first bonding structures 4150. The second structure 4200 may include a common source line 4205, a gate stack structure 4210 disposed between the common source line 4205 and a first structure 4100, channel structures 4220 penetrating through a gate stack structure 4210 and an isolation region 4230, memory channel structures 4220 and second bonding structures 4250 electrically connected to word lines (WL in FIG. 9) of the gate stack structure 4210. For example, the second bonding structures 4250 may be electrically connected to the memory channel structures 4220 and word lines through the first contact plugs 4235 and 152 electrically connected to the bit lines 4240 and word lines electrically connected to the memory channel structures 4220. The first bonding structures 4150 of the first structure 4100 and the second bonding structures 4250 of the second structure 4200 may be in contact with and may be bonded to each other. Portions of the first bonding structures 4150 and the second bonding structures 4250 bonded to each other may be formed of, for example, copper (Cu), although embodiments of the present inventive concept are not limited thereto.

Each of the semiconductor chips 2200 may include diffusion barriers 160 disposed between the first to third contact plugs 152, 154, and 156 and the source structure 101, as illustrated in the enlarged view. Each of the semiconductor chips 2200 may further include one or more input/output pads 2210 (see FIG. 10) electrically connected to the peripheral wires 4110 of the first structure 4100.

The semiconductor chips 2200 may be electrically connected to each other by connection structures 2400 (see FIG. 10) in the form of bonding wires. However, in example embodiments, semiconductor chips in a semiconductor package, such as the semiconductor chips 2200, may be electrically connected to each other by a connection structure including a through-electrode (e.g., TSV).

According to the aforementioned example embodiments, in a structure in which two or more substrate structures are bonded to each other, by disposing a diffusion barrier between the source structure and the contact plug, a semiconductor device having improved reliability and a data storage system including the same may be provided.

It will be understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as "above," "below," "upper" and "lower" may be used herein to indicate a position of elements, structures or features relative to one another as illustrated in the figures, rather than absolute position. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While the inventive concept has been particularly shown and described with reference to embodiments thereof, it will be understood that various changes in form and details may be made therein by a person of ordinary skill in the art given the teachings herein without departing from the spirit and scope of the following claims.

What is claimed is:

1. A semiconductor device, comprising:
a first substrate structure including a substrate, circuit devices on the substrate, a first interconnection structure on the circuit devices, and first bonding pads on the first interconnection structure; and
a second substrate structure disposed on the first substrate structure and connected to the first substrate structure, the second substrate structure having a first region and a second region,
wherein the second substrate structure includes:
a source structure;
gate electrodes stacked and spaced apart from each other below the source structure in a first direction perpendicular to a lower surface of the source structure, the gate electrodes extending to different lengths in a second direction parallel to the lower surface of the source structure in the second region and forming pad regions having different levels in the first direction;
channel structures penetrating through the gate electrodes, extending in the first direction in the first region, each of the channel structures including a channel layer;
first contact plugs electrically connected to the gate electrodes and extending in the first direction in the second region;
a second contact plug extending in the first direction in an external side of the gate electrodes and electrically connected to the source structure;
a diffusion barrier between the second contact plug and the source structure, extending along a portion of the lower surface of the source structure, the diffusion barrier comprising an electrically conductive material;
a second interconnection structure below the first and second contact plugs in the first direction; and
second bonding pads below the second interconnection structure in the first direction and connected to the first bonding pads.

2. The semiconductor device of claim 1, wherein the diffusion barrier covers an upper surface of the second contact plug and a portion of a side surface of the second contact plug connected to the upper surface.

3. The semiconductor device of claim 1, wherein an upper end of the second contact plug is in the source structure, and the diffusion barrier covers the upper end of the second contact plug.

4. The semiconductor device of claim 1, wherein a level of a lower end of the diffusion barrier is higher than a level of an uppermost surface of the gate electrodes in the first direction.

5. The semiconductor device of claim 1, wherein the diffusion barrier includes a material having a melting point higher than a melting point of amorphous silicon.

6. The semiconductor device of claim 1, wherein the diffusion barrier includes at least one of a silicon-carbon-based material, a metal nitride, and a two-dimensional layered semiconductor material.

7. The semiconductor device of claim 6, wherein the two-dimensional layered semiconductor material is at least one of graphene, boron nitride (BN), boron carbon nitride (BCN), molybdenum disulfide ($MoS_2$), molybdenum diselenide ($MoSe_2$), tungsten disulfide ($WS_2$), and tungsten diselenide ($WSe_2$).

8. The semiconductor device of claim 1, wherein a cross-sectional thickness of the diffusion barrier is in a range of about 0.1 nanometers (nm) to about 10 nm.

9. The semiconductor device of claim 1,
wherein the diffusion barrier includes a plurality of diffusion barriers, and
wherein the first contact plugs penetrate through the gate electrodes and extend into the source structure in the first direction, and at least upper surfaces of the first contact plugs are covered by the diffusion barriers, respectively.

10. The semiconductor device of claim 9, wherein the second substrate structure further includes an upper insulating layer between the diffusion barriers and the source structure on the first contact plugs.

11. The semiconductor device of claim 9, wherein the diffusion barriers are laterally spaced apart from each other between the first and second contact plugs adjacent to each other.

12. The semiconductor device of claim 1, wherein the diffusion barrier is configured to cover an upper portion of a side surface of the second contact plug and to leave exposed a lower portion of the side surface of the second contact plug.

13. The semiconductor device of claim 1,
wherein the channel structures extend, in the first direction, into the source structure, and
wherein the diffusion barrier does not extend onto the channel structures.

14. The semiconductor device of claim 1, wherein the source structure includes polycrystalline silicon.

15. A semiconductor device, comprising:
a first substrate structure including a substrate, circuit devices on the substrate, and first bonding pads on the circuit devices; and
a second substrate structure disposed on the first substrate structure and connected to the first substrate structure,
wherein the second substrate structure includes:
a source structure;
gate electrodes stacked and spaced apart from each other below the source structure in a first direction perpendicular to a lower surface of the source structure;
first contact plugs electrically connected to the gate electrodes and extending in the first direction;
a second contact plug extending in the first direction in an external side of the gate electrodes and electrically connected to the source structure through an upper end of the second contact plug;

a diffusion barrier between the second contact plug and the source structure, wherein a level of a lower end of the diffusion barrier is higher, in the first direction, than a level of an uppermost surface of the gate electrodes; and second bonding pads below the gate electrodes in the first direction and connected to the first bonding pads.

16. The semiconductor device of claim 15, wherein a level of an upper end of the diffusion barrier is lower, in the first direction, than a level of an upper end of the source structure.

17. The semiconductor device of claim 15, wherein the diffusion barrier covers an upper surface of the second contact plug.

18. The semiconductor device of claim 15, wherein the diffusion barrier includes a material having a melting point higher than a melting point of amorphous silicon.

19. A data storage system, comprising:

a semiconductor storage device including a first substrate structure including circuit devices and first bonding pads, a second substrate structure including gate electrodes and second bonding pads connected to the first bonding pads, and at least one input/output pad electrically connected to the circuit devices; and a controller electrically connected to the semiconductor storage device through the at least one input/output pad and configured to control the semiconductor storage device, wherein the second substrate structure further includes:

a source structure on the gate electrodes;

first contact plugs electrically connected to the gate electrodes and extending in a first direction perpendicular to a lower surface of the source structure;

a second contact plug extending in the first direction in an external side of the gate electrodes and electrically connected to the source structure through an upper end of the second contact plug; and a diffusion barrier between the second contact plug and the source structure, wherein a level of a lower end of the diffusion barrier is higher, in the first direction, than a level of an uppermost surface of the gate electrodes.

20. The data storage system of claim 19, wherein the diffusion barrier includes a region extending in a second direction parallel to the lower surface of the source structure along a portion of the lower surface of the source structure.

* * * * *